United States Patent
Sato et al.

(10) Patent No.: US 9,077,978 B2
(45) Date of Patent: Jul. 7, 2015

(54) IMAGE-CAPTURING APPARATUS AND IMAGE-CAPTURING METHOD

(75) Inventors: Shuzo Sato, Kanagawa (JP); Eiji Otani, Kanagawa (JP); Ken Ozawa, Kanagawa (JP); Seiji Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 323 days.

(21) Appl. No.: 13/697,175

(22) PCT Filed: May 19, 2011

(86) PCT No.: PCT/JP2011/061521
§ 371 (c)(1),
(2), (4) Date: Nov. 9, 2012

(87) PCT Pub. No.: WO2011/148851
PCT Pub. Date: Dec. 1, 2011

(65) Prior Publication Data
US 2013/0063569 A1    Mar. 14, 2013

(30) Foreign Application Priority Data

May 28, 2010    (JP) ................................. 2010-122820
Apr. 13, 2011    (JP) ................................. 2011-089238

(51) Int. Cl.
*H04N 13/02* (2006.01)
*G03B 35/08* (2006.01)
(Continued)

(52) U.S. Cl.
CPC ............ *H04N 13/0217* (2013.01); *G03B 35/08* (2013.01); *H01L 27/14603* (2013.01); *H01L 27/14625* (2013.01); *H04N 9/045* (2013.01); *H04N 13/0257* (2013.01)

(58) Field of Classification Search
CPC .................................................. H04N 13/0217
USPC .......................................................... 348/46
See application file for complete search history.

(56) References Cited

U.S. PATENT DOCUMENTS 5,886,816 A * 3/1999 Faris ............................. 359/464

FOREIGN PATENT DOCUMENTS

| JP | 02-171737 | 7/1990 |
| JP | 04-251239 | 9/1992 |

(Continued)

OTHER PUBLICATIONS

International Search Report; Application No. PCT/JP2011/061521; Date of completion of the international search: Jun. 21, 2011.

(Continued)

*Primary Examiner* — Christopher S Kelley
*Assistant Examiner* — Jonathan Messmore
(74) *Attorney, Agent, or Firm* — Fishman Stewart Yamaguchi PLLC

(57) ABSTRACT

This invention relates to capturing an image of a subject as a three-dimensional image using a single image-capturing apparatus. The image-capturing apparatus includes a first polarization means, a lens system, and an image-capturing device array having a second polarization means. The first polarization means includes first and second regions arranged along a first direction, and the second polarization means includes multiple third and fourth regions arranged alternately along a second direction. First region transmission light having passed the first region passes the third region and reaches the image-capturing device, and second region transmission light having passed the second region passes the fourth region and reaches the image-capturing device. Thus, an image is captured to obtain a three-dimensional image in which a distance between a barycenter $BC_1$ of the first region and a barycenter $BC_2$ of the second region is a base line length of parallax between two eyes.

25 Claims, 22 Drawing Sheets

(51) Int. Cl.
   *H01L 27/146* (2006.01)
   *H04N 9/04* (2006.01)

(56) References Cited

FOREIGN PATENT DOCUMENTS

| JP | 06-054991 A | 3/1994 |
| JP | 07-043639 | 2/1995 |
| JP | 2001-016611 | 1/2001 |
| JP | 2001-045521 | 2/2001 |
| JP | 2004-309868 | 11/2004 |
| JP | 2009-157043 | 7/2009 |
| JP | 2010-004090 | 1/2010 |

OTHER PUBLICATIONS

PCT of the Written Opinion of the International Searching Authority; Application No. PCT/JP2011/061521; Date of completion of Opinion: Jun. 21, 2011.

Chinese Office Action issue Dec. 3, 2014 for corresponding Chinese Application No. 201180030777.7.

* cited by examiner

FIG. 12
[SIXTH EMBODIMENT]
(A)
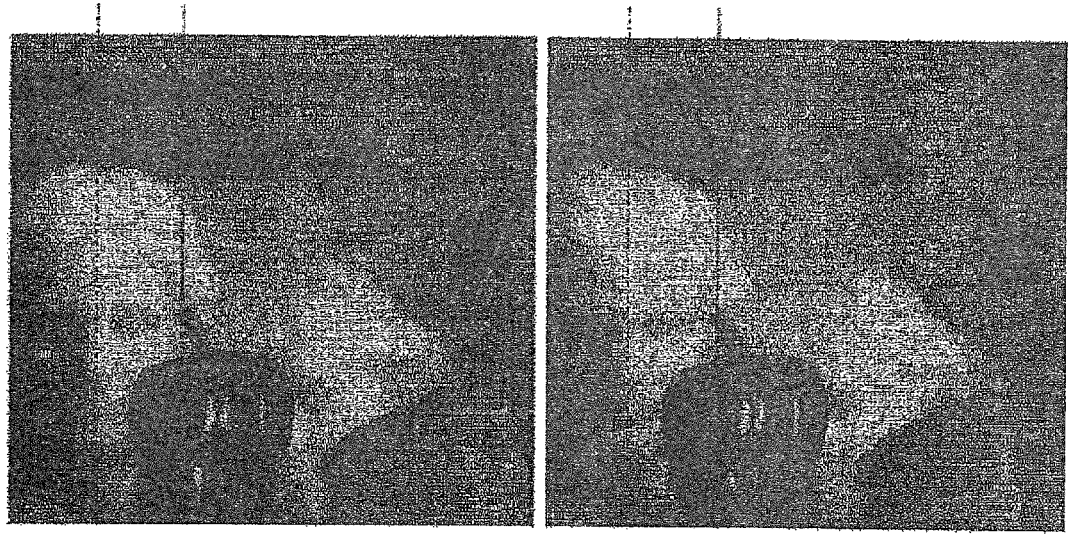
(B)
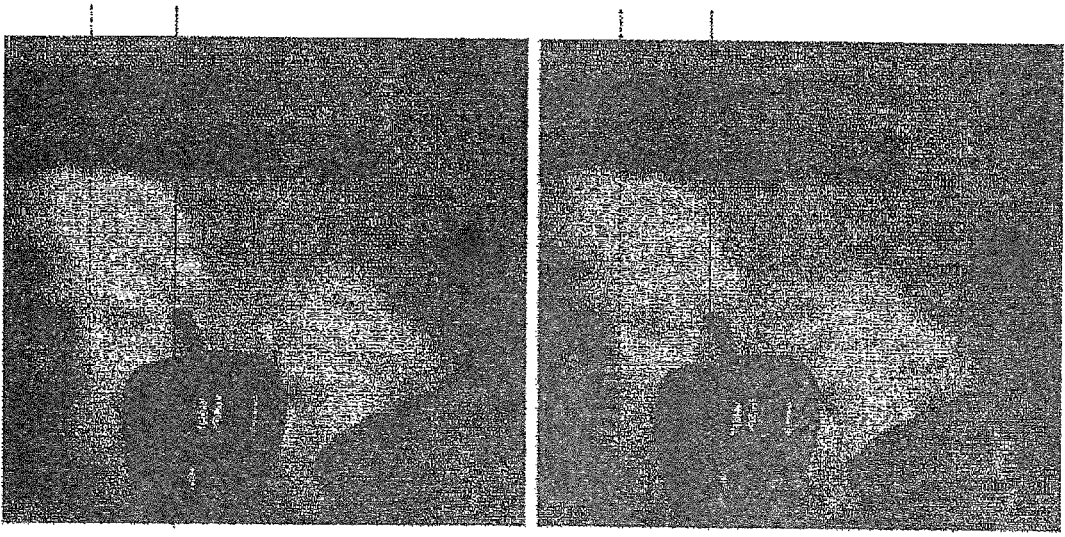

[SEVENTH EMBODIMENT]

(EIGHTH EMBODIMENT)

(EIGHTH EMBODIMENT)

(EIGHTH EMBODIMENT)

(EIGHTH EMBODIMENT)

(EIGHTH EMBODIMENT)

IMAGE-CAPTURING APPARATUS AND IMAGE-CAPTURING METHOD

TECHNICAL FIELD

This disclosure relates to an image-capturing apparatus and an image-capturing method. More particularly, this disclosure relates to an image-capturing apparatus and an image-capturing method for capturing a subject as a three-dimensional image.

BACKGROUND ART

In the past, a system has been suggested, which causes two video cameras provided at the right and left to simultaneously capture images of a subject, and displays a three-dimensional image by simultaneously outputting the obtained two types of images (right eye image and left eye image). However, when the two video cameras are used, the size of the apparatus increases, which is not practical. A base line length between the two video cameras, i.e., a distance between both eyes as a three-dimensional camera, is often set at about 65 mm corresponding to the distance between both eyes of a person regardless of a zoom ratio of the lenses. In such case, in a zoomed-up image, parallax between both eyes increases, and this forces the optical system of an observer to perform information processing that is different from ordinary processing, and this becomes a cause of visual fatigue. When a moving subject is captured by two video cameras, it is necessary to perform precise synchronization control of the two video cameras, which is extremely difficult, and it is also extremely difficult to precisely control a convergence angle.

In order to facilitate adjustment of a lens system for three-dimensional shooting, a three-dimensional shooting apparatus has been suggested, which shares the same optical system by combining polarization filters for polarization in directions perpendicular to each other (for example, see Japanese Patent Application Publication No. H6-054991).

A method has been suggested, in which three-dimensional shooting is performed by an image-capturing apparatus including two lenses and image-capturing means (for example, see Japanese Patent Application Laid-Open No. 2004-309868). The image-capturing apparatus disclosed in this Japanese Patent Application Laid-Open includes: image-capturing means in which pixels corresponding to an integral multiple of a predetermined number of scan lines are provided on an image-capturing surface; a first horizontal component polarization means for passing a horizontal component of a first video light from a subject; and a first vertical component polarization means which is provided at a position away from the first horizontal component polarization means by a predetermined distance, and which passes only a vertical component of a second video light from the subject, wherein the horizontal component that is passed by the first horizontal component polarization means is condensed onto pixels of a predetermined range on the image-capturing surface, and the vertical component that is passed by the first vertical component polarization means is condensed onto pixels of in a remaining range except the predetermined range. More specifically, the horizontal component polarization filter and the vertical component polarization filter spaced apart with an interval corresponding to parallax of a person are provided with two lenses at positions away from each other by a predetermined distance from the image-capturing surface of the CCD.

CITATION LIST

Patent Documents

Patent Document 1: Japanese Patent Application Publication No. H6-054991
Patent Document 2: Japanese Patent Application Laid-Open No. 2004-309868

SUMMARY OF THE INVENTION

Problems to be Solved by the Invention

By the way, in the technique disclosed in Japanese Patent Application Publication No. H6-054991, the optical path is made into one system by overlaying the outputs of the two polarization filters, whereby the same lens system is shared. However, in order to extract a right eye image and a left eye image in a later stage, polarization filters are required in addition, so that the optical path itself is divided again to allow the light to be incident upon separate polarization filters, and this causes loss of light in the lens system, and moreover, there is a problem in that it is difficult to reduce the size of the apparatus. In the technique disclosed in Japanese Patent Application Laid-Open No. 2004-309868, two combinations of lenses and polarization filters are required, and this inevitably results in a complicated and large apparatus. It is not practical to take not only a three-dimensional image but also ordinary two-dimensional image using the above image-capturing apparatuses, because the apparatuses are complicated.

Therefore, it is a first object of this disclosure to provide an image-capturing apparatus and an image-capturing method using the related image-capturing apparatus having a simple configuration and structure, wherein a subject can be captured by a single image-capturing apparatus as a three-dimensional image. A second object of this disclosure is to provide an image-capturing apparatus having a simple configuration and structure and capable of shooting an ordinary two-dimensional image.

Solution to Problems

In order to achieve the above first object, an image-capturing apparatus according to a first aspect of this disclosure includes: (A) first polarization means for polarizing light from a subject; (B) a lens system for condensing light from the first polarization means; and (C) an image-capturing device array in which image-capturing devices are arranged in a two-dimensional matrix form in a first direction and a second direction perpendicular to the first direction, wherein second polarization means is provided at a light incident side, and the image-capturing device array converts the light condensed by the lens system into an electric signal, wherein the first polarization means includes a first region and a second region arranged along the first direction, a polarization state of a first region transmission light having passed the first regions is different from a polarization state of a second region transmission light having passed the second regions, second polarization means includes a plurality of third regions and fourth regions arranged alternately along the second direction and extending in the first direction, a polarization state of a third region transmission light having passed the third regions is different from a polarization state of a fourth region transmission light having passed the fourth regions, the first region transmission light passes the third regions and reaches the image-capturing device, and the second region transmission light passes the fourth region and reaches the image-capturing device, and thus, an image is captured to obtain a three-dimensional image in which a distance between a barycenter of the first region and a barycenter of the second region is a base line length of parallax between both of the eyes.

In order to achieve the above first object, an image-capturing method according to this disclosure is an image-capturing method using the image-capturing apparatus according to the first aspect of this disclosure, wherein the image-capturing device generates an electric signal for obtaining a right eye image with the first region transmission light having passed the third region and having reached the image-capturing device, the image-capturing device generates an electric signal for obtaining a left eye image with the second region transmission light having passed the fourth region and having reached the image-capturing device, and these electric signal are output. These electric signals may be output at a time, or may be output alternately in time series.

In order to achieve the above object, an image-capturing apparatus according to a second aspect of this disclosure includes: (A) a quarter wavelength plate; (B) a lens system for condensing light from the quarter wavelength plate; and (C) an image-capturing device array in which image-capturing devices are arranged in a two-dimensional matrix form in a first direction and a second direction perpendicular to the first direction, wherein polarization means is provided at a light incident side, and the image-capturing device array converts the light condensed by the lens system into an electric signal, wherein the polarization means includes a plurality of first regions and second regions arranged alternately along the second direction and extending in the first direction, a polarization state of a first region transmission light having passed the first regions is different from a polarization state of a second region transmission light having passed the second regions, and a fast axis of the quarter wavelength plate is at a predetermined angle to the direction of the electric field of the first region transmission light.

It should be noted that the first region of the image-capturing apparatus according to the second aspect of this disclosure substantially corresponds to the third region of the image-capturing apparatus according to the first aspect of this disclosure, and the second region of the image-capturing apparatus according to the second aspect of this disclosure substantially corresponds to the fourth region of the image-capturing apparatus according to the first aspect of this disclosure. In this case, in order to avoid making confusion between the first region of the image-capturing apparatus according to the second aspect of this disclosure and the first of the image-capturing apparatus according to the first aspect of this disclosure, the first region of the image-capturing apparatus according to the second aspect of this disclosure is referred to as "fifth region" for the sake of convenience, and in order to avoid making confusion between the second region of the image-capturing apparatus according to the second aspect of this disclosure and the second region of the image-capturing apparatus according to the first aspect of this disclosure, the second region of the image-capturing apparatus according to the second aspect of this disclosure is referred to as "sixth region" for the sake of convenience. On the other hand, light having passed the fifth region is referred to as "fifth region transmission light", and light having passed the sixth region is referred to as "sixth region transmission light".

Effects Of The Invention

In the image-capturing apparatus or the image-capturing method according to the first aspect of this disclosure, the image-capturing apparatus is constituted by one set of first polarization means and second polarization means and one lens system, and therefore, a small monocular image-capturing apparatus having a simple configuration and structure can be provided. Since it is not necessary to have two sets of combinations of lenses and polarization filters, there would be not displacement or difference in zoom, diaphragm, focus, convergence angle, and the like. Moreover, a base line length of the parallax between both of the eyes is relatively short, and therefore, natural three-dimensional feeling can be obtained. In addition, by attaching and detaching the first polarization means, two-dimensional images and three-dimensional images can be easily obtained. With the image-capturing apparatus according to the second aspect of this disclosure, the image-capturing apparatus having a simple configuration and structure can capture an ordinary two-dimensional image, and in addition, the image-capturing apparatus according to the second aspect of this disclosure can be easily incorporated into the image-capturing apparatus according to the first aspect of this disclosure, and therefore, not only a three-dimensional image can be shot, but also an ordinary two-dimensional image can be shot easily with high quality.

BRIEF DESCRIPTION OF DRAWINGS

FIGS. 12(A) and 12(B) are figures serving as pictures of left eye images and right eye images showing a result obtained by researching relationship between extinction ratio and parallax in a sixth embodiment.

MODES FOR CARRYING OUT THE INVENTION

Figure 1:
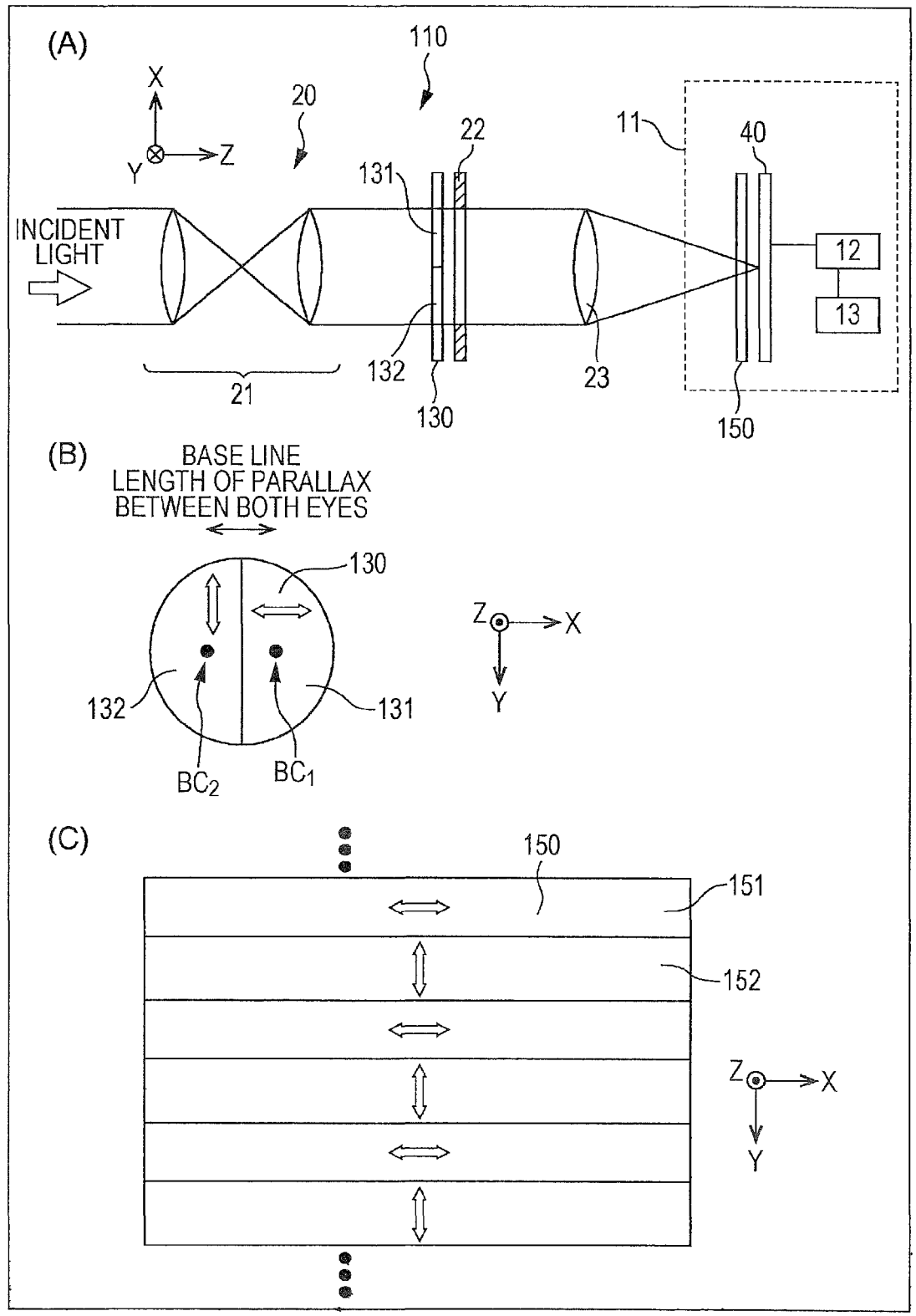
FIGS. 1(A), 1(B), and 1(C) are conceptual diagrams of an image-capturing apparatus according to a first embodiment, and is a diagram schematically illustrating the state of polarization of first polarization means and second polarization means.

Hereinafter, this disclosure will be explained on the basis of embodiments with reference to drawings. However, this disclosure is not limited to the embodiments. In the embodiments, various numerical values and materials are merely examples. Explanation will be made in the following order.

1. Overall explanation about image-capturing apparatuses and image-capturing methods according to the first and second aspects of this disclosure
2. First embodiment (image-capturing apparatus and image-capturing method according to first aspect of this disclosure)
3. Second embodiment (modification of first embodiment)
4. Third embodiment (another modification of first embodiment)
5. Fourth embodiment (another modification of first embodiment)
6. Fifth embodiment (another modification of first embodiment)
7. Sixth embodiment (another modification of first embodiment)
8. Seventh embodiment (another modification of first embodiment)
9. Eighth embodiment (another modification of first embodiment)
10. Ninth embodiment (image-capturing apparatus according to second aspect of this disclosure and another modification of first embodiment)
11. Tenth embodiment (modification of ninth embodiment), others

[Overall Explanation about Image-Capturing Apparatuses and Image-Capturing Methods According to the First and Second Aspects of this Disclosure]

In the image-capturing apparatus according to the first aspect of this disclosure or the image-capturing apparatus suitable for use with the image-capturing method of this disclosure, the first polarization means is preferably arranged in proximity to a diaphragm unit of the lens system. Alternatively, when light incident upon the lens system is once made into parallel light, and is ultimately condensed (forms an image) on the image-capturing device, the first polarization means is preferably arranged in a portion of the lens system in the parallel light state. In these modes, in general, it is not necessary to newly redesign the optical system of the lens system, and mechanical (physical) design change may be applied by fixing the first polarization means to the existing lens system or allowing it to be detachably attached thereto. In order to detachably attach the first polarization means to the lens system, for example, the first polarization means is made to have configuration and the structure similar to that of diaphragm blades of a lens, and may be arranged in the lens system. Alternatively, the configuration and the structure may be such that, in the lens system, a member having both the first polarization means and an aperture portion is attached to the rotation shaft so as to be rotatable about the rotation shaft in parallel to the optical axis of the lens system, and such member is rotated about the rotation shaft, so that light ray passing the lens system passes the aperture portion or passes the first polarization means. Alternatively, the configuration and the structure may be such that, in the lens system, for example, a member having both the first polarization means and an aperture portion is attached to the lens system in a slidable manner in a direction perpendicular to the optical axis of the lens system, and such member is caused to slide, so that light ray passing the lens system passes the aperture portion or the first polarization means.

In the image-capturing apparatus according to the first aspect of this disclosure or the image-capturing apparatus suitable for use with the image-capturing method of this disclosure including the above preferable modes, a central region may be provided between the first region and the second region in the first polarization means, and a polarization state of a central region transmission light having passed the central region does not change from that before incidence to the central region. That is, the central region is a transparent state in respect to the polarization. In the central region of the first polarization means, the light density is high, and the amount of parallax is small. Therefore, in this modes, while the light density received by the image-capturing device array is maintained at a high level, a sufficient base line length of the parallax between both of the eyes can be ensured. When the external shape of the first polarization means is a circular shape, the central region may be in a circular shape, and the first region and the second region may be in a shape of sector having a central angle of 180 degrees enclosing the central region, or the central region may be in a rhombic or square shape, and the first region and the second region may be in a shape similar to a sector having a central angle of 180 degrees enclosing the central region. Alternatively, the first region, the central region, and the second region are in a belt-like shape extending in the second direction.

In the image-capturing apparatus according to the first aspect of this disclosure or the image-capturing apparatus suitable for use with the image-capturing method of this disclosure including various kinds of preferred embodiments explained above (hereinafter, these image-capturing apparatuses may be referred to as "the image-capturing apparatus according to the first aspect of this disclosure and the like"), the first region and the second region may be formed of polarizers, and the direction of the electric field of the first region transmission light may be configured to be perpendicular to the direction of the electric field of the second region transmission light. Further, in the image-capturing apparatus according to the first aspect of this disclosure and the like including such configuration, the direction of the electric field of the first region transmission light may be configured to be parallel to the first direction, or the direction of the electric field of the first region transmission light may be configured to be at an angle of 45 degrees to the first direction. Further, in the image-capturing apparatus according to the first aspect of this disclosure and the like including any combination of these configurations, the direction of the electric field of the first region transmission light may be configured to be parallel to the direction of the electric field of the third region transmission light, and the direction of the electric field of the second region transmission light may be configured to be parallel to the direction of the electric field of the fourth region transmission light. Further, in the image-capturing apparatus according to the first aspect of this disclosure and the like including any combination of these configurations, the extinction ratio of the polarizer is 3 or more, and more preferably, it is 10 or more.

In this case, "polarizer" means one making linear polarization from natural light (non-polarization) and circular polarization, and the polarizer itself constituting the first region and the second region may be a polarizer (polarization plate) of a well-known configuration and structure. For example, the polarization component of one of the first region transmission light and the second region transmission light is configured to be mainly S wave (TE wave), and the polarization component of the other of the first region transmission light and the second region transmission light is configured to be mainly P wave (TM wave). The polarization state of the first region transmission light and the second region transmission light may be linear polarization or may be circular polarization (where rotation directions are opposite to each other). In general, transverse wave of which oscillation direction is only in a certain particular direction is referred to as polarized wave, and this oscillation direction is referred to as polarization direction or polarization axis. The direction of the electric field of light is the same as the polarization direction. When the direction of the electric field of the first region transmission light is configured to be parallel to the first direction, the extinction ratio in the first region means a ratio between a component of light included in the light passing the first region of which direction of the electric field is in the first direction and a component of light included in the light passing the first region of which direction of the electric field is in the second direction, and the extinction ratio in the second region means a ratio between a component of light included in the light passing the second region of which direction of the electric field is in the second direction and a component of light included in the light passing the second region of which direction of the electric field is in the first direction. When the direction of the electric field of the first region transmission light is configured to be at 45 degrees to the first direction, the extinction ratio in the first region means a ratio between a component of light included in the light passing the first region of which direction of the electric field is at 45 degrees to the first direction and a component of light included in the light passing the first region of which direction of the electric field is at 135 degrees to the first direction, and the extinction ratio in the second region means a ratio between a component of light included in the light passing the second region of which direction of the electric field is at 135 degrees to the first direction and a component of light included in the light passing the second region of which direction of the electric field is at 45 degrees to the first direction. Alternatively, for example, when the polarization component of the first region transmission light is mainly P wave, and the polarization component of the second region transmission light is mainly S wave, the extinction ratio in the first region may be a ratio between the P polarization component and the S polarization component included in the first region transmission light, and the extinction ratio in the second region may be a ratio between the S polarization component and the P polarization component included in the second region transmission light.

In the image-capturing apparatus according to the first aspect of this disclosure and the like including various kinds of preferred modes and configurations explained above, the image-capturing device may be formed of a photoelectric conversion device, and formed of a color filter, an on-chip lens, and a wire grid polarizer laminated thereon or thereabove, and the wire grid polarizer may constitute the third region or the fourth region. Alternatively, the image-capturing device may be formed of a photoelectric conversion device, and formed of a wire grid polarizer, a color filter, and, and an on-chip lens laminated thereon or thereabove, and the wire grid polarizer may constitute the third region or the fourth region. Alternatively, the image-capturing device may be formed of a photoelectric conversion device, and formed of an on-chip lens, a color filter, and, and a wire grid polarizer laminated thereon or thereabove, and the wire grid polarizer may constitute the third region or the fourth region. However, the order in which the on-chip lens, the color filter, and the wire grid polarizer are laminated may be changed as necessary. In these modes, when the direction of the electric field of the first region transmission light is configured to be parallel to the first direction, the direction in which multiple wires constituting the wire grid polarizer extend may be parallel to the first direction or the second direction. More specifically, in the wire grid polarizer constituting the third region, the direction in which the wires extend is parallel to the second direction, and in the wire grid polarizer constituting the fourth region, the direction in which the wires extend is parallel to the first direction. Alternatively, in these modes, when the direction of the electric field of the first region transmission light is configured to be at 45 degrees to the first direction, the direction in which multiple wires constituting the wire grid polarizer extend may be at 45 degrees to the first direction or the second direction. More specifically, in the wire grid polarizer constituting the third region, the direction in which the wires extend is at 135 degrees to the first direction, and in the wire grid polarizer constituting the fourth region, the direction in which the wires extend is at 45 degrees to the first direction. The direction in which the wire extends is the light absorbing axis of the wire grid polarizer, and the direction perpendicular to the direction in which the wire extends is the light transmitting axis of the wire grid polarizer. Basically, the above explanation can also be applied to the image-capturing apparatus according to the second aspect of this disclosure.

Further, in the image-capturing apparatus according to the first aspect of this disclosure and the like including various kinds of preferred modes and configurations explained above, a quarter wavelength plate ($\lambda/4$ wavelength plate) is preferably arranged at the light incident side of the first polarization means in order to avoid so-called binocular rivalry. The quarter wavelength plate may be provided at all times or may be provided as necessary. More specifically, the quarter wavelength plate may be detachably attached to the filter attachment unit provided in the lens system. In this case, for example, the binocular rivalry means a phenomenon in which, when an image of a subject that reflects P wave component but absorbs S wave component such as water surface or a window is captured, and the image obtained from the P wave component and the image obtained from the S wave component are presented to both eyes, fusion does not occur, and the images are seen alternately in such a manner that only one of the images is seen more strongly, and the images suppress each other in an overlapping region. The light that passed the quarter wavelength plate is in a state in which the polarization direction is the same, and great difference does not occur between images of a portion of a subject that reflects the P wave component but absorbs the S wave component which are between an image obtained when such light passes the first region and the third region and reaches the image-capturing device array and an image obtained when such light passes the second region and the fourth region and reaches the image-capturing device array, and therefore, the binocular rivalry can be avoided. It should be noted that the quarter wavelength plate fast axis is at an angle of 45 degrees or 45 degrees±10 degrees to the direction of the electric field of the first region transmission light.

Alternatively, as described above, in a configuration in which the first region and the second region are formed of polarizers, and a direction of an electric field of the first region transmission light is perpendicular to a direction of an electric field of the second region transmission light, and the direction of the electric field of the first region transmission light is parallel to the first direction, or in a configuration in which the direction of the electric field of the first region transmission light is at an angle of 45 degrees to the first direction, the quarter wavelength plate is arranged at the light incident side of the first polarization means, and the fast axis of the quarter wavelength plate is at a predetermined angle to the direction of the electric field of the first region transmission light, or the quarter wavelength plate may include a first quarter wavelength plate and a second quarter wavelength plate arranged in the second direction, a fast axis of the first quarter wavelength plate may be at a predetermined angle to the direction of the electric field of the first region transmission light, and a fast axis of the second quarter wavelength plate may be perpendicular to the fast axis of the first quarter wavelength plate (in other words, parallel to the slow axis of the first quarter wavelength plate), and in these modes, the predetermined angle may be 45 degrees or 45 degrees±10 degrees, and further, in these modes, the direction of the electric field of the first region transmission light may be parallel to the direction of the electric field of the third region transmission light, and the direction of the electric field of the second region transmission light may be parallel to the direction of the electric field of the fourth region transmission light. Further in these modes, the first polarization means may be detachably attached to the lens system, and the quarter wavelength plate is detachably attached to the lens system. Still further in these modes, the quarter wavelength plate may be provided adjacent to the first polarization means, for example; the quarter wavelength plate may be provided at the light incident side of the first polarization means.

In the image-capturing apparatus according to the second aspect of this disclosure, the quarter wavelength plate may include a first quarter wavelength plate and a second quarter wavelength plate arranged in the second direction, a fast axis of the first quarter wavelength plate is at a predetermined angle to the direction of the electric field of the fifth region transmission light, and a fast axis of the second quarter wavelength plate is perpendicular to the fast axis of the first quarter wavelength plate (in other words, parallel to the slow axis of the first quarter wavelength plate). In the image-capturing apparatus according to the second aspect of this disclosure including such modes, the predetermined angle may be 45 degrees or 45 degrees±10 degrees, and further, in the image-capturing apparatus according to the second aspect of this disclosure including such modes, the direction of the electric field of the fifth region transmission light may be perpendicular to the direction of the electric field of the sixth region transmission light, and in this case, the direction of the electric field of the fifth region transmission light may be parallel to the first direction, or the direction of the electric field of the fifth region transmission light is at an angle of 45 degrees to the first direction. Further, in the image-capturing apparatus according to the second aspect of this disclosure including these modes, the quarter wavelength plate may be detachably attached to the lens system.

In order to detachably attach the quarter wavelength plate to the lens system, for example, the quarter wavelength plate is made to have configuration and the structure similar to that of diaphragm blades of a lens, and may be arranged in the lens system. Alternatively, the configuration and the structure may be such that, in the lens system, a member having both the quarter wavelength plate and an aperture portion is attached to the rotation shaft so as to be rotatable about the rotation shaft in parallel to the optical axis of the lens system, and such member is rotated about the rotation shaft, so that light ray passing the lens system passes the aperture portion or passes the quarter wavelength plate. Alternatively, the configuration and the structure may be such that, in the lens system, for example, a member having both the quarter wavelength plate and an aperture portion is attached to the lens system in a slidable manner in a direction perpendicular to the optical axis of the lens system, and such member is caused to slide, so that light ray passing the lens system passes the aperture portion or the quarter wavelength plate. In this case, the following configuration may be employed: the quarter wavelength plate includes a plurality of members, and each member is configured to be slidable in the direction perpendicular to the optical axis of the lens system.

Alternatively, in the image-capturing apparatus according to the first aspect of this disclosure and the like, in order to avoid the so-called binocular rivalry, a polarization plate having a polarization axis of a degrees may be arranged at the light incident side of the first polarization means, the first region may include a first wavelength plate, and the second region may include a second wavelength plate, and the direction of the electric field of the first region transmission light may be perpendicular to the direction of the electric field of the second region transmission light. In this case, more specifically, the value of a may be 45 degrees, the first wavelength plate may include a half wavelength plate ($+\lambda/2$ wavelength plate), and the second wavelength plate may include a half wavelength plate ($-\lambda/2$ wavelength plate) of which phase difference is different from the half wavelength plate constituting the first wavelength plate. In this case, the polarization plate having the polarization axis of $\alpha$ degrees is fixed to the lens system.

In the image-capturing apparatus according to the first aspect of this disclosure and the like including various kinds of preferred modes and configurations explained above, the image-capturing device array may have Bayer arrangement, one pixel may include four image-capturing devices, and one third region and/or fourth region may be provided for one pixel. In the image-capturing apparatus according to the first aspect of this disclosure and the like including various kinds of preferred modes and configurations explained above including these modes, one third region and one fourth region may be arranged for N pixels along the second direction (where N is $2^n$, n being a natural number of 1 to 5). However, the arrangement of the image-capturing device array is not limited to Bayer arrangement. Other arrangements include interline arrangement, G stripe RB checkboard arrangement, G stripe RB complete checkboard arrangement, checkboard complementary color arrangement, stripe arrangement, diagonal stripe arrangement, primary color difference arrangement, field color difference successive arrangement, frame color difference successive arrangement, MOS-type arrangement, improved MOS-type arrangement, frame interleave arrangement, field interleave arrangement. Basically, the above explanation can also be applied to the image-capturing apparatus according to the second aspect of this disclosure.

In an image-capturing method of this disclosure using the image-capturing apparatus according to the first aspect of this disclosure and the like including various kinds of preferred modes and configurations explained above, one third region and one fourth region are arranged for N pixels along the second direction (where for example, N is $2^n$, n being a natural number of 1 to 5), and in this case, image data (right eye image data) for obtaining a right eye image and image data (left eye image data) for obtaining a left eye image may be obtained on the basis of depth map (depth information) generated from an electric signal obtained from first region transmission light that has passed the third region and an electric signal obtained from second region transmission light that has passed the fourth region and an electric signal from all the image-capturing devices constituting the image-capturing device array. Basically, the above explanation can also be applied to the image-capturing apparatus according to the second aspect of this disclosure.

Alternatively, when the arrangement of the image-capturing device array is Bayer arrangement, the third region and the fourth region may not be provided for a red image-capturing device receiving red light and a blue image-capturing device receiving blue light, and the third region may be provided for one of two green image-capturing devices receiving green light and the fourth region may be provided for the other of them. Alternatively, when the arrangement of the image-capturing device array is Bayer arrangement, the third region or the fourth region may be provided for two image-capturing device adjacent to each other in the first direction (for example, a red image-capturing device receiving red light and one of green image-capturing devices receiving green light) among one red image-capturing device receiving red light, one blue image-capturing device receiving blue light, and two green image-capturing devices receiving green light, and the fourth region or the third region may be arranged for the remaining two image-capturing devices (for example, a blue image-capturing device receiving blue light and the other of the green image-capturing devices receiving green light). Alternatively, when the arrangement of the image-capturing device array is Bayer arrangement, the third region or the fourth region may be provided for any one of image-capturing devices (for example, one red image-capturing device receiving red light or one blue image-capturing device receiving blue light) among one red image-capturing device receiving red light, one blue image-capturing device receiving blue light, and two green image-capturing devices receiving green light, and the fourth region or the third region may be provided for an image-capturing device adjacent to the image-capturing device in the second direction (for example, a green image-capturing device). Even in these cases, one third region and one fourth region may be configured to be arranged for N pixels along the second direction, and one third region or one fourth region may be configured to be arranged for M pixels along the first direction. Basically, the above explanation can also be applied to the image-capturing apparatus according to the second aspect of this disclosure.

In the image-capturing method according to this disclosure or the image-capturing apparatus according to the first to second aspects of this disclosure including various kinds of preferred modes and configurations explained above (hereinafter, they may be simply, collectively referred to as "this disclosure"), the first direction may be the horizontal direction, and the second direction may be the vertical direction. The unit length of the third region and the fourth region along the first direction (the image-capturing apparatus according to the first aspect of this disclosure and the like) or the fifth region and the sixth region (the image-capturing apparatus according to the second aspect of this disclosure) may be, for example, the same as the length along the first direction of the image-capturing device (when the direction of the electric field of the first region transmission light is parallel to the first direction), or may be the same as the length equivalent to one image-capturing device (when the direction of the electric field of the first region transmission light is at an angle of 45 degrees to the first direction). The lens system may be a fixed focal length lens, or may be so-called zoom lens, and the configuration and the structure of the lens and the lens system may be determined based on the specification required for the lens system. The image-capturing device may be a CCD sensor, a CMOS sensor, or a signal amplification type image sensor of CMD (Charge Modulation Device) type. The image-capturing apparatus may be a front side illumination type solid-state image-capturing apparatus, or may be a back side illumination type solid-state image-capturing apparatus. Further, for example, a digital still camera, a video camera, and a camcorder can be made with the image-capturing apparatus according to the first aspect to second aspect.

When the wire grid polarizer is formed of the third region and the fourth region (the image-capturing apparatus according to the first aspect of this disclosure and the like) or the fifth region and the sixth region (the image-capturing apparatus according to the second aspect of this disclosure), the wire constituting the wire grid polarizer is not limited, but is preferably formed of aluminum (Al) or aluminum alloy, a value of a ratio between the width of the wire and the pitch of the wire [(the width of the wire)/(the pitch of the wire)] is preferably 0.33 or more, the height of the wire is preferably equal to or more than $5 \times 10^{-8}$ m, and 10 or more wires are preferably provided.

In the image-capturing apparatus according to the first aspect of this disclosure and the like, the barycenter of the first region means a barycenter obtained based on the external shape of the first region, and the barycenter of the second region means a barycenter obtained based on the external shape of the second region. When the external shape of the first polarization means is in a circular shape having a radius r, and each of the first region and the second region is in a crescentic shape occupying half of the first polarization means, the distance between the barycenter of the first region and the barycenter of the second region can be obtained with simple calculation $[(8r)/(3\pi)]$.

First Embodiment

The first embodiment relates to an image-capturing apparatus and an image-capturing, method according to a first aspect of this disclosure. More particularly, the first embodiment relates to an image-capturing apparatus and an image-capturing method for capturing a subject as a three-dimensional image.

Figure 2:
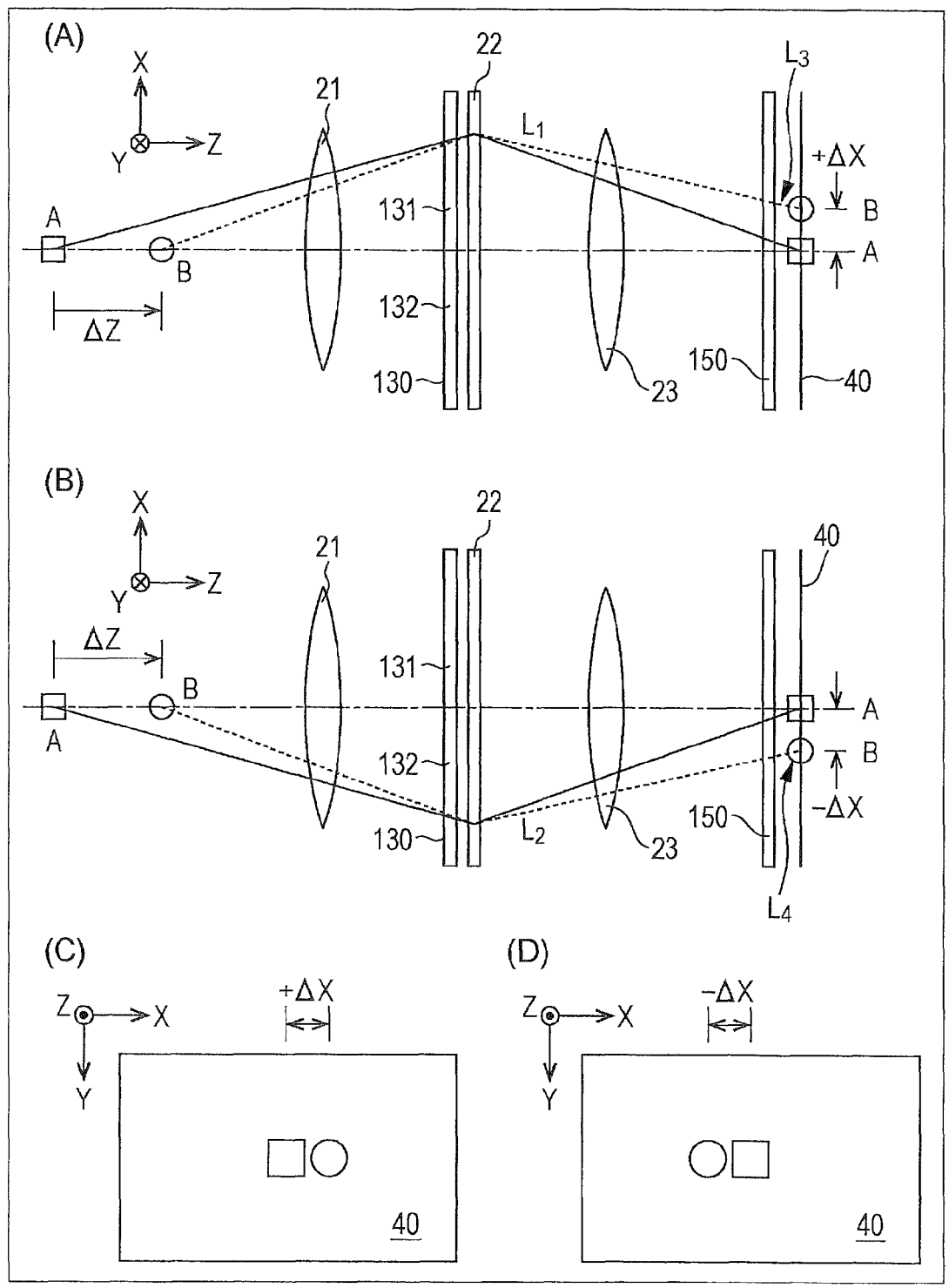
FIGS. 2(A) and 2(B) are a conceptual diagram illustrating light that passes a first region of the first polarization means and a third region of the second polarization means and reaches an image-capturing device array and a conceptual diagram illustrating light that passes a second region of the first polarization means and a fourth region of the second polarization means and reaches the image-capturing device array in the image-capturing apparatus according to the first embodiment.
FIGS. 2(C) and 2(D) are diagrams schematically illustrating images formed on the image-capturing device array by the lights as shown in FIGS. 2(A) and 2(B).

A conceptual diagram illustrating an image-capturing apparatus according to the first embodiment is shown in FIG. 1(A). The states of polarization of first polarization means and second polarization means is schematically shown in FIGS. 1(B) and 1(C). A conceptual diagram illustrating light that passes a lens system, a first region of the first polarization means, and a third region of the second polarization means and reaches an image-capturing device array is shown in FIG. 2(A). A conceptual diagram illustrating light that passes a second region of the first polarization means and a fourth region of the second polarization means and reaches an image-capturing device array is shown in FIG. 2(B). An image formed on the image-capturing device array by the lights of FIGS. 2(A) and 2(B) are schematically shown in FIGS. 2(C) and 2(D). In the explanation below, a direction in which light moves is denoted as a Z axis direction, a first direction is denoted as a horizontal direction (X axis direction), and a second direction is denoted as a vertical direction (Y axis direction).

An image-capturing apparatus according to the first embodiment or the second to the tenth embodiments explained later includes: (A) first polarization means 130, 230, 330, 430, 530, 930 for polarizing light from a subject; (B) a lens system 20 for condensing light from the first polarization means 130, 230, 330, 430, 530, 930, and (C) an image-capturing device array 40 in which image-capturing devices 41 are arranged in a two-dimensional matrix form in a first direction (horizontal direction, X axis direction) and a second direction perpendicular to the first direction (vertical direction, Y axis direction), wherein second polarization means 150, 250 are provided at a light incident side, and the image-capturing device array 40 converts the light condensed by the lens system 20 into an electric signal.

The image-capturing apparatus according to the first embodiment or the second to the tenth embodiments explained later is configured such that: the first polarization means 130, 230, 330, 430, 530, 930 includes first regions 131, 231, 331, 531, 931 and second regions 132, 232, 332, 532, 932 arranged along the first direction (horizontal direction, X axis direction), a polarization state of a first region transmission light $L_1$ having passed the first regions 131, 231, 331, 531, 931 is different from a polarization state of a second region transmission light $L_2$ having passed the second regions 132, 232, 332, 532, 932, second polarization means 150, 250 include multiple third regions 151, 251 and fourth regions 152, 252 arranged alternately along the second direction (vertical direction, Y axis direction) and extending in the first direction (horizontal direction, X axis direction), a polarization state of a third region transmission light $L_3$ having passed the third regions 151, 251 is different from a polarization state of a fourth region transmission light $L_4$ having passed the fourth regions 152, 252, the first region transmission light $L_1$ passes the third regions 151, 251 and reaches the image-capturing device 41, and the second region transmission light $L_2$ passes the fourth region 152, 252 and reaches the image-capturing device 41, and therefore, images are captured to obtain a three-dimensional image in which a distance between a barycenter $BC_1$ of the first regions 131, 231, 331, 531, 931 and a barycenter $BC_2$ of the second regions 132, 232, 332, 532, 932 is a base line length of the parallax between both of the eyes.

In this case, in the image-capturing apparatus according to the first embodiment or the second to the tenth embodiments explained later, a lens system 20 includes, for example, an image-capturing lens 21, a diaphragm unit 22, and an image forming lens 23, and functions as a zoom lens. The image-capturing lens 21 is a lens for condensing incident light from the subject. The image-capturing lens 21 includes a focus lens for focus, a zoom lens for enlarging the subject, and the like, and in general, the image-capturing lens 21 is achieved with a combination of multiple lenses for correcting chromatic aberration and the like. The diaphragm unit 22 has a function of reduction for adjusting the amount of condensed light, and in general, the diaphragm unit 22 is constituted by a combination of multiple plate-like blades. At least at the position of the diaphragm unit 22, the light from one point of the subject becomes parallel light. The image forming lens 23 forms an image on the image-capturing device array 40 with the light having passed the first polarization means 130, 230, 330, 430, 530, 930. The image-capturing device array 40 is arranged in a camera main body unit 11. In the above configuration, the entrance pupil is located at the camera main body unit with respect to the image forming lens 23. For example, a digital still camera, a video camera, and a camcorder are constituted by the image-capturing apparatus.

The camera main body unit 11 includes not only the image-capturing device array 40 but also, for example, image processing means 12 and an image storage unit 13. Then, on the basis of the electric signal converted by the image-capturing device array 40, right eye image data and left eye image data are formed. The image-capturing device array 40 is achieved with, for example, a CCD (Charge Coupled Devices), a CMOS (Complementary Metal Oxide Semiconductor) image sensor, and the like. The image processing means 12 converts the electric signal which is output from the image-capturing device array 40 into the right eye image data and the left eye image data, and records the right eye image data and the left eye image data to the image storage unit 13.

The first polarization means 130, 230, 330, 430, 530, 930 are arranged in proximity to the diaphragm unit 22 of the lens system 20. More specifically, the first polarization means 130, 230, 330, 430, 530, 930 are arranged as close to the diaphragm unit 22 as possible as long as operation of the diaphragm unit 22 is not affected. As described above, the first polarization means 130, 230, 330, 430, 530, 930 are arranged at a portion of the lens system 20 which is in the state of parallel light when the light which is incident upon the lens system 20 is once made into parallel light and is ultimately condensed (made to form an image) on the image-capturing device 41.

In the image-capturing apparatus 110 according to the first embodiment, the first polarization means 130 includes a first region 131 and a second region 132. More specifically, the external shape of the first polarization means 130 is a circular shape, and each of the first region 131 and the second region 132 has a crescentic external shape occupying half of the first polarization means 130. A border line between the first region 131 and the second region 132 extends along the second direction. The first polarization means 130 including a combination of two polarization filters separates the incident light into two different polarization states. As described above, the first polarization means 130 includes polarizers symmetrical in the vertical direction, and generates polarizations in straight line directions perpendicular to each other or polarizations in rotation directions opposite to each other, at two positions at the right and left with respect to the upright state of the camera. The first region 131 is a filter for applying polarization to an image with which the subject is to be seen by the right eye (light which is to be received by the right eye). On the other hand, the second region 132 is a filter for applying polarization to an image with which the subject is to be seen by the left eye (light which is to be received by the left eye).

In this case, in the image-capturing apparatus 110 according to the first embodiment, the first region 131 and second region 132 are formed of polarizers. The direction of the electric field of the first region transmission light $L_1$ (indicated by an outline arrow) is perpendicular to the direction of the electric field of the second region transmission light $L_2$ (indicated by an outline arrow) (see FIG. 1(B)). In this case, in the first embodiment, the direction of the electric field of the first region transmission light $L_1$ is parallel to the first direction. More specifically, for example, the first region transmission light $L_1$ mainly includes P wave (TM wave) as a polarization component, and the second region transmission light $L_2$ mainly includes S wave (TE wave) as a polarization component. Further, the direction of the electric field of the first region transmission light $L_1$ is parallel to the direction of the electric field of the third region transmission light $L_3$ (indicated by an outline arrow), and the direction of the electric field of the second region transmission light $L_2$ is parallel to the direction of the electric field of the fourth region transmission light $L_4$ (indicated by an outline arrow) (see FIG. 1(C)). The extinction ratio of each polarizer is three or more, and more specifically, ten or more.

In the image-capturing apparatus 110 according to the first embodiment, the external shape of the first polarization means 130 is in a circular shape of which radius r is 10 mm. The first region 131 and the second region 132 are made as crescentic shapes each occupying half of the first polarization means 130. Therefore, the distance between the barycenter $BC_1$ of the first region 131 and the barycenter $BC_2$ of the second region 132 is $[(8r)/(3\pi)]=8.5$ mm.

Figure 3:
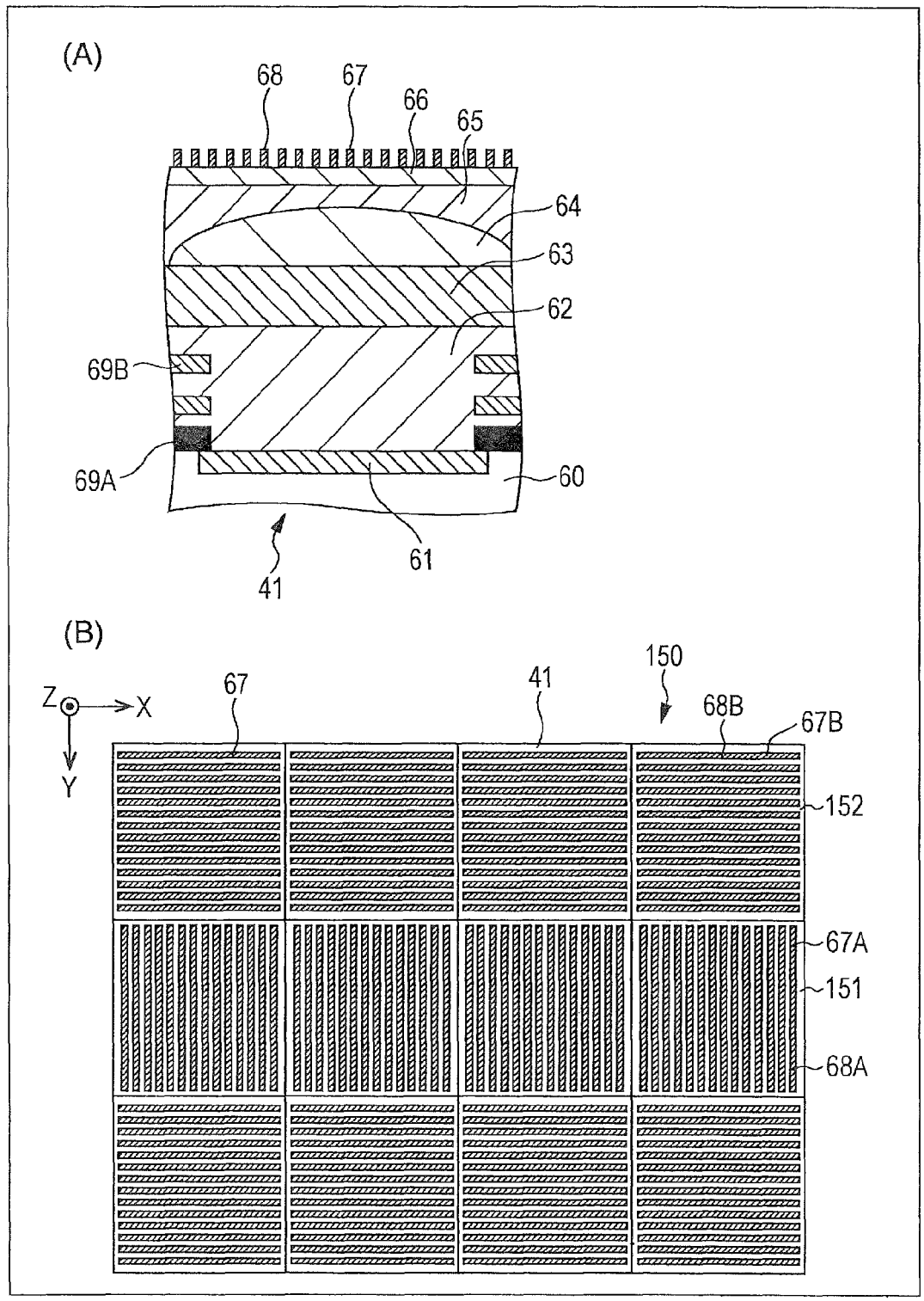
FIGS. 3(A) and 3(B) are a partial cross sectional view schematically illustrating an image-capturing device in the image-capturing apparatus according to the first embodiment, and a figure schematically illustrating an arrangement state of a wire grid polarizer.

A schematic partial cross sectional view is shown in FIG. 3(A), and the arrangement state of the wire grid polarizer 67 is schematically shown in FIG. 3(B). As shown in FIGS. 3(A) and 3(B), the image-capturing device 41 includes, for example, a photoelectric conversion device 61 arranged on a silicon semiconductor substrate 60. In addition, a first planarized film 62, a color filter 63, an on-chip lens 64, a second planarized film 65, an inorganic insulating ground layer 66, and a wire grid polarizer 67 are laminated on the photoelectric conversion device 61. The wire grid polarizer 67 constitutes each of the third region 151 and the fourth region 152. In FIG. 3(B), a border region of pixels are denoted with a solid line.

The direction in which multiple wires 68 constituting the wire grid polarizer 67 extend is parallel to the first direction or the second direction. More specifically, in the wire grid polarizer 67A constituting the third region 151, the direction in which the wire 68A extends is parallel to the second direction, and in the wire grid polarizer 67B constituting the fourth region 152, the direction in which the wire 68B extends is parallel to the first direction. The direction in which the wire 68 extends becomes a light absorbing axis of the wire grid polarizer 67, and the direction perpendicular to the direction in which the wire 68 extends becomes the light transmitting axis of the wire grid polarizer 67.

In the image-capturing method according to the first embodiment, the electric signal for obtaining the right eye image data is generated by the image-capturing device 41 with the first region transmission light $L_1$ that has passed the third region 151 and that has reached the image-capturing device 41. On the other hand, the electric signal for obtaining the left eye image data is generated by the image-capturing device 41 with the second region transmission light $L_2$ that has passed the fourth region 152 and that has reached the image-capturing device 41. Then, these electric signals are output at a time or alternately in time series. The image processing means 12 performs image processing on the output electric signals (the electric signals for obtaining the right eye image data and the left eye image data which are output by the image-capturing device array 40), and records them as the right eye image data and the left eye image data to the image storage unit 13.

As schematically shown in FIGS. 2(A) and 2(B), the lens system 20 is focused on a rectangular object A. A circular object B is located in proximity to the lens system 20 than the object A. The in-focus image of the rectangular object A is formed on the image-capturing device array 40. The out-of-focus image of the circular object B is formed on the image-capturing device array 40. In the example as shown in FIG. 2(A), on the image-capturing device array 40, the image of the object B is formed at a position away by a distance $(+\Delta X)$ toward the right hand side of the object A. In the example as shown in FIG. 2(B), on the image-capturing device array 40, the image of the object B is formed at a position away by a distance $(-\Delta X)$ toward the left hand side of the object A. Therefore, the distance $(2\times\Delta X)$ is information about the depth of the object B. That is, the amount of defocus and defocus direction of an object located closer to the image-capturing apparatus than the object A are different from the amount of defocus and defocus direction of the object located farther from the image-capturing apparatus, and the amount of defocus of the object B is different according to the distance between the object A and the object B. A three-dimensional image can be obtained in which the distance between the barycenters of the shapes of the first region 131 and the second region 132 in the first polarization means 130 is the base line length of the parallax between both of the eyes. That is, the three-dimensional image can be obtained based on a well-known method from the right eye image (see the schematic view of FIG. 2(C)) and the left eye image (see the schematic view of FIG. 2(D)) thus obtained. When the right eye image data and the left eye image data are mixed, an ordinary two-dimensional (flat surface) image which is not the three-dimensional image can be obtained.

Figure 4:
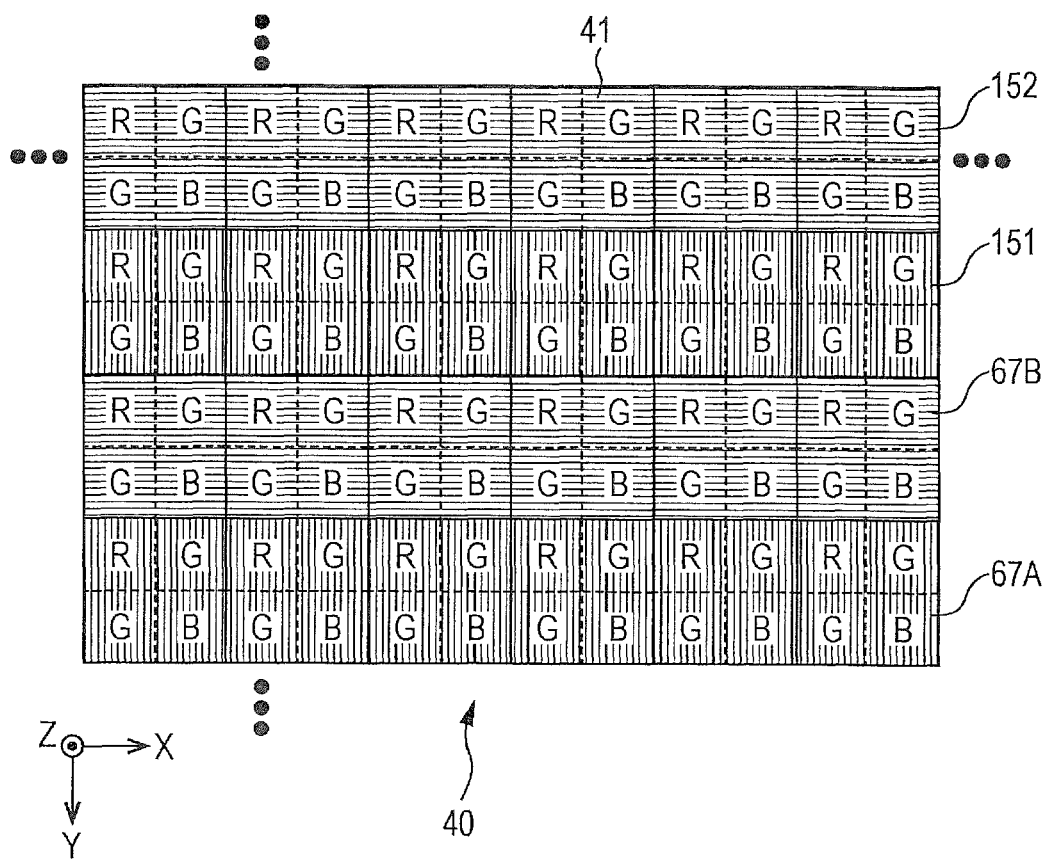
FIG. 4 is a conceptual diagram illustrating an image-capturing device array having Bayer arrangement in the image-capturing apparatus according to the first embodiment.

As FIG. 4 shows the conceptual diagram, in the first embodiment, the image-capturing device array 40 has Bayer arrangement, and one pixel includes four image-capturing devices (one red image-capturing device R receiving red color, one blue image-capturing device B receiving blue color, and two green image-capturing devices G receiving green color). The third region 151 is arranged for one line of pixel group arranged along the first direction. Likewise, the fourth region 152 is arranged, adjacent to this pixel group in the second direction, for one line of pixel group arranged along the first direction. The third region 151 and the fourth region 152 are arranged alternately in the second direction. It should be noted that the third region 151 and the fourth region 152 extend in the first direction as a whole, but a unit length along the first direction and the second direction of the third region 151 and the fourth region 152 is the same as the length along the first direction and the second direction of the image-capturing device 41. With this configuration, a belt-like image extending in the first direction based on the light mainly having the P wave component (right eye image) and a belt-like image extending in the first direction based on the light mainly having the S wave component (left eye image) are generated alternately along the second direction. In FIG. 4, the third region 151 is shaded with vertical lines, and the fourth region 152 is shaded with horizontal lines. These schematically represent the wires of the wire grid polarizers 67A, 67B.

As described above, the electric signals for the right eye image data and left eye image data are generated along the second direction in some kind of interlaced manner. Accordingly, the image processing means 12 applies demosaic processing on the electric signals in order to generate the right eye image data and the left eye image data, and for example, by performing interpolation processing based on super-resolution processing, the right eye image data and the left eye image data are ultimately generated and made. For example, the parallax may be emphasized and optimized by a parallax detection technique for generating a disparity map by stereo matching from the left eye image data and the right eye image data and a parallax control technique for controlling parallax based on the disparity map.

Figure 5:
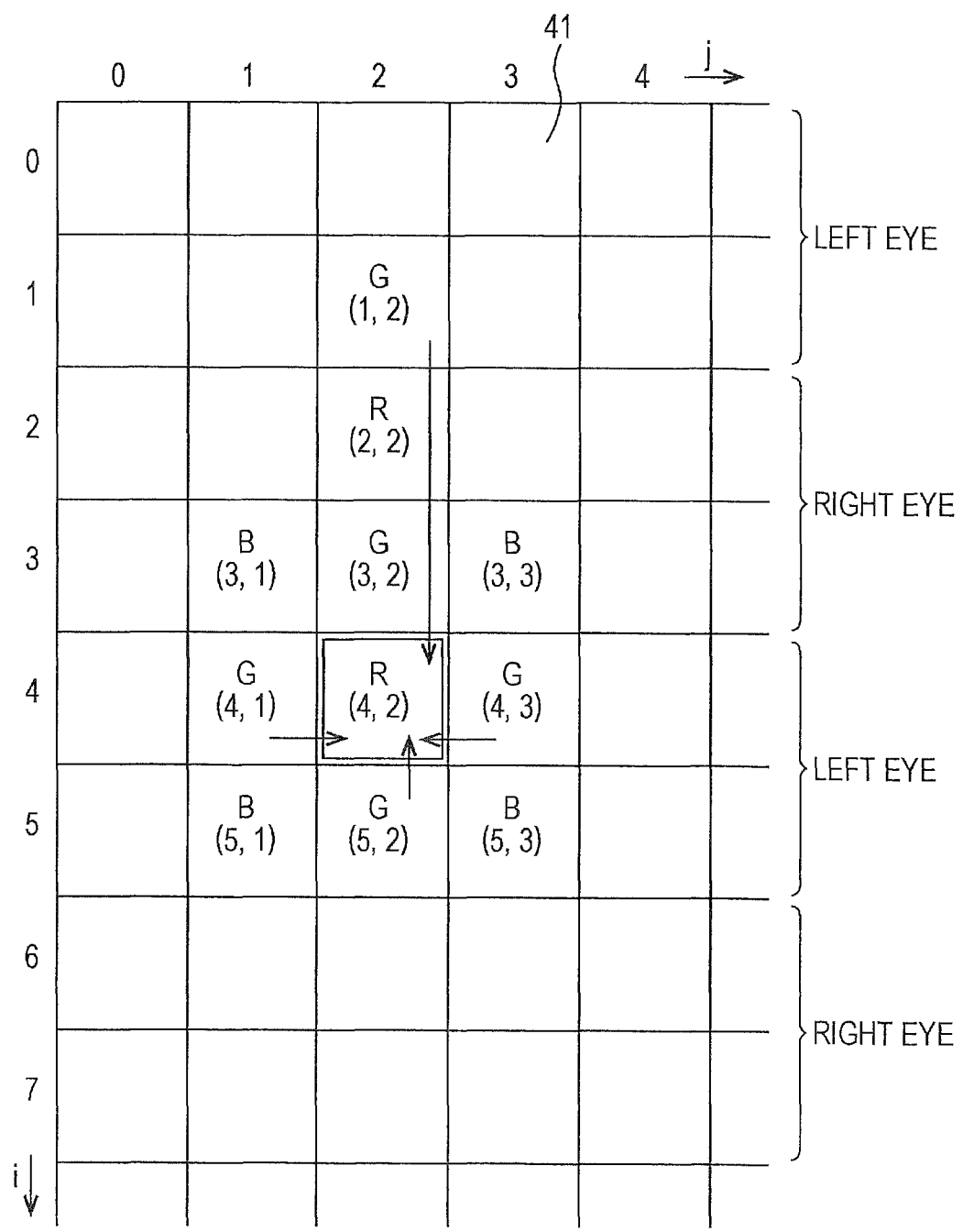
FIG. 5 is a conceptual diagram illustrating an image-capturing device array having Bayer arrangement for explaining image processing for obtaining a signal value by performing demosaic processing on an electric signal obtained from an image-capturing device.

FIG. 5 is a conceptual diagram illustrating an image-capturing device array having Bayer arrangement for explaining image processing (mosaic processing) for obtaining a signal value by performing demosaic processing on an electric signal obtained from an image-capturing device. It should be noted that FIG. 5 shows an example for generating a signal value concerning a green image-capturing device in the left eye image. In ordinary demosaic processing, an average value of electric signals of image-capturing devices of the same color in proximity is used in general. However, when, like the first embodiment, a pixel group for obtaining the right eye image data (pixel row) and a pixel group for obtaining the left eye image data (pixel row) are alternately repeated, use of values in proximity as they are may make it impossible to obtain original image data. Accordingly, the demosaic processing is performed in view of whether the electric signals of the looked up image-capturing device corresponds to which of the right eye image data and the left eye image data.

In Bayer arrangement, the red image-capturing device R is arranged at the position (4, 2). At this occasion, operation represented by the following expression is performed to generate a green image-capturing device signal value g' corresponding to the position (4, 2).

$$g'_{4,2}=(g_{4,1}+g_{4,3}+g_{5,2}+g_{1,2}\times W_3)/(3.0+W_3)$$

In this case, $g'_{i,j}$ at the left-hand side is a green image-capturing device signal value at the position (i, j). On the other hand, $g_{i,j}$ at the right-hand side is a value of an electric signal of the green image-capturing device at the position (i, j). Further, when a distance ($W_1$) from the image-capturing device $G_{4,2}$ in question to each of adjacent image-capturing devices $G_{4,1}$, $G_{4,3}$, $G_{5,2}$ is "1.0", a reciprocal number thereof is adopted as a weight, and "3.0" corresponds to a summation of the weights. Likewise, $W_3$ is a weight for the value of the electric signal of the image-capturing device $G_{1,2}$ which is away by 3 image-capturing devices, and in this case, $W_3$ is "⅓". When the above expression is generalized, the following expression is obtained. when i is an even number (signal value of the green image-capturing device G corresponding to the position of the red image-capturing device R);

$$g'_{i,j}=(g_{i,j-1}\times W_1+g_{i,j+1}\times W_1+g_{i+1,j}\times W_1+g_{i-3,j}\times W_3)/(W_1\times 3.0+W_3)$$

when i is an odd number (signal value of the green image-capturing device G corresponding to the position of the blue image-capturing device B);

$$g'_{i,j}=(g_{i,j-1}\times W_1+g_{i,j+1}\times W_1+g_{i-1,j}\times W_1+g_{i+3,j}\times W_3)/(W_1\times 3.0+W_3)$$

In this case, $W_1$ is 1.0, and $W_3$ is ⅓.

With the red image-capturing device R and the blue image-capturing device B, the demosaic processing can be performed according to the same idea.

With the demosaic processing, the image-capturing device signal value at each image-capturing device position can be obtained. At this stage, as described above, this is in some kind of interlaced manner. For this reason, for a region that does not have any image-capturing device signal value, the image-capturing device signal value need to be generated by interpolation. Methods of interpolation include well-known methods such as a method using an arithmetic mean value of values in proximity. It should be noted that this interpolation processing may be performed in parallel with the demosaic processing. In the first direction, the image quality is maintained completely, and therefore, image quality deterioration such as reduction of the resolution of the entire image is less likely to occur.

In the first embodiment, the image-capturing apparatus 110 is constituted by a pair of first polarization means 130 and second polarization means 150 and one lens system 20. Therefore, for example, two different images separated to the right and the left can be generated at a time, and a small monocular image-capturing apparatus having a simple configuration and structure and having less number of components can be provided. Since it is not necessary to have two sets of combinations of lenses and polarization filters, there would be not displacement or difference in zoom, diaphragm, focus, convergence angle, and the like. Moreover, a base line length of the parallax between both of the eyes is relatively short, and therefore, natural three-dimensional feeling can be obtained. In addition, when the structure for attaching and detaching the first polarization means 130 is employed, two-dimensional images and three-dimensional images can be easily obtained.

Second Embodiment

The second embodiment is a modification of the first embodiment. In the first embodiment, the direction of the electric field of the first region transmission light $L_1$ is parallel to the first direction. In contrast, in the second embodiment, the direction of the electric field of the first region transmission light $L_1$ is at 45 degrees to the direction of the first direction. The states of polarization of first polarization means 230 and second polarization means 250 provided in an image-capturing apparatus according to the second embodiment are schematically shown in FIGS. 6(A) and 6(B).

Figure 7:
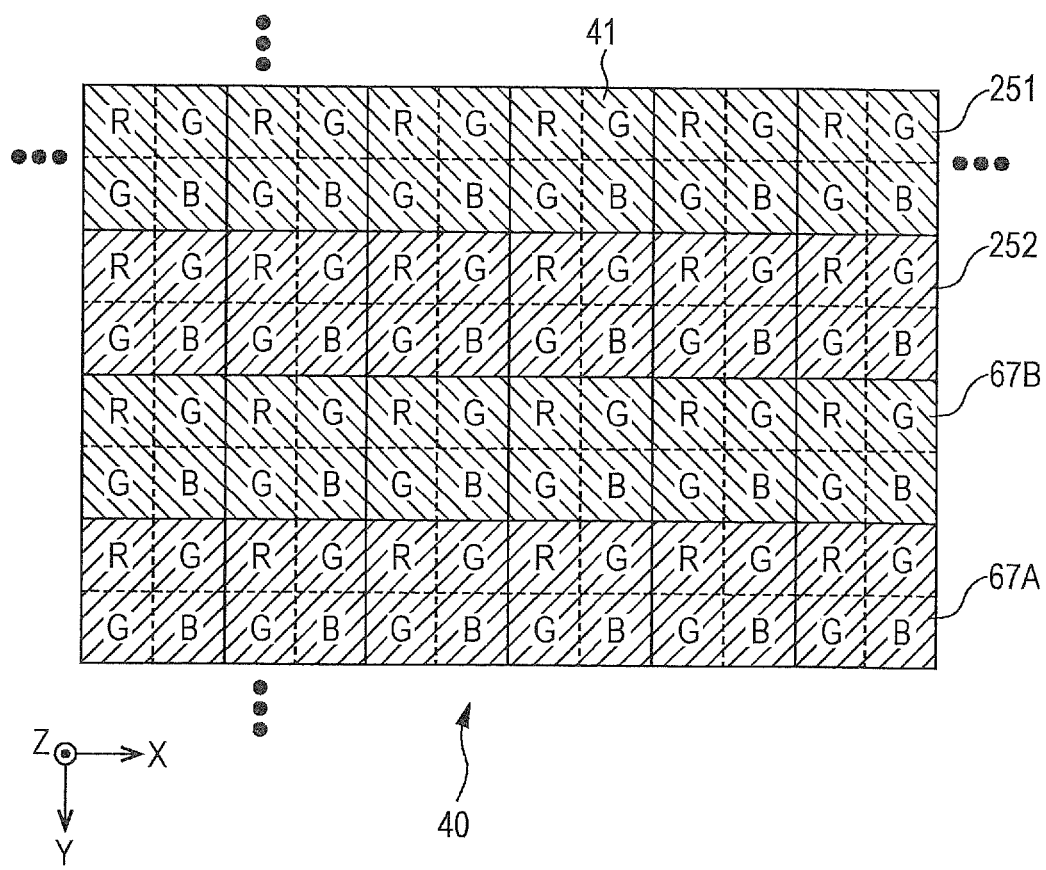
FIG. 7 is a conceptual diagram illustrating an image-capturing device array having Bayer arrangement in the image-capturing apparatus according to the second embodiment.

A conceptual diagram illustrating the image-capturing device array 40 having Bayer arrangement is shown in FIG. 7.

In the second embodiment, an image-capturing device array 40 is configured such that one pixel includes four image-capturing devices (one red image-capturing device R receiving red color, one blue image-capturing device B receiving blue color, and two green image-capturing devices G receiving green color). A third region 251 is arranged for one line of pixel group arranged along the first direction. Likewise, a fourth region 252 is arranged, adjacent to this pixel group in the second direction, for one line of pixel group arranged along the first direction. The third region 251 and the fourth region 252 are arranged alternately in the second direction. It should be noted that the third region 251 and the fourth region 252 extend in the first direction as a whole, but a unit length of the third region 251 and the fourth region 252 is the same as the length of one image-capturing device. With this configuration, a belt-like image extending in the first direction based on the light mainly having the P wave component (right eye image) and a belt-like image extending in the first direction based on the light mainly having the S wave component (left eye image) are generated alternately along the second direction. In FIG. 7, the third region 251 and the fourth region 252 are shaded with diagonal lines, but these schematically represent the wires of the wire grid polarizers.

Except these features, the configuration and the structure of the image-capturing apparatus according to the second embodiment may be the same as the configuration and the structure of the image-capturing apparatus 110 explained in the first embodiment, and detailed description thereabout is omitted. The configuration and the structure of the image-capturing apparatus according to the second embodiment can be applied to the image-capturing apparatuses according to the third embodiment to the tenth embodiment explained later.

Third Embodiment

The third embodiment is also a modification of the first embodiment. In an image-capturing apparatus according to the third embodiment, first polarization means 330 is configured such that a central region 333 is provided between a first region 331 and a second region 332, and the polarization state of the central region transmission light that has passed the central region 333 does not change from the polarization state of the light before incidence to the central region 333. That is, the central region 333 is a transparent state in respect to the polarization.

By the way, when the incident light passes the first polarization means, the amount of light decreases in proportional to the spectral characteristics and the extinction ratio, and the light becomes darker. In this case, the extinction ratio is a ratio between the amount of light selected by a polarizer and allowed to pass upon being and the amount of leaking light reflected or absorbed which is not selected by the polarizer. More specifically, for example, when the polarizer has an extinction ratio of 10 and passes a P wave component, the polarizer passes light as follows. With respect to an intensity 100 of incident natural light having a ratio 50:50 of P wave component:S wave component, the polarizer passes the P wave component and the S wave component with a ratio 50:5. For example, when the polarizer has an extinction ratio of ∞ and passes a P wave component, the polarizer passes 100% of the P wave component, and totally reflects the S wave component or completely absorbs it, thus not passing the S wave component. Therefore, when average natural light is incident thereupon, the brightness becomes about ½. The amount of light passing the first polarization means 130 and the second polarization means 150 as shown in FIGS. 1(B) and 1(C) is about 25% of the amount of light that has not yet entered into the first polarization means 130 even if the transmission loss is zero. When the light that passed the first region and second region becomes a mixed state and is incident upon the image-capturing device array 40 in such a manner that the light cannot be separated, the base line length of the parallax between both of the eyes decreases in proportional to the ratio of mixing, and the left eye image and the right eye image become the same image in a completely mixed state. Therefore, parallax cannot be obtained, and the image cannot be seen as the three-dimensional view.

In the central region 333 of the first polarization means 330, the light density is strong but the amount of parallax is small.

Figure 8:
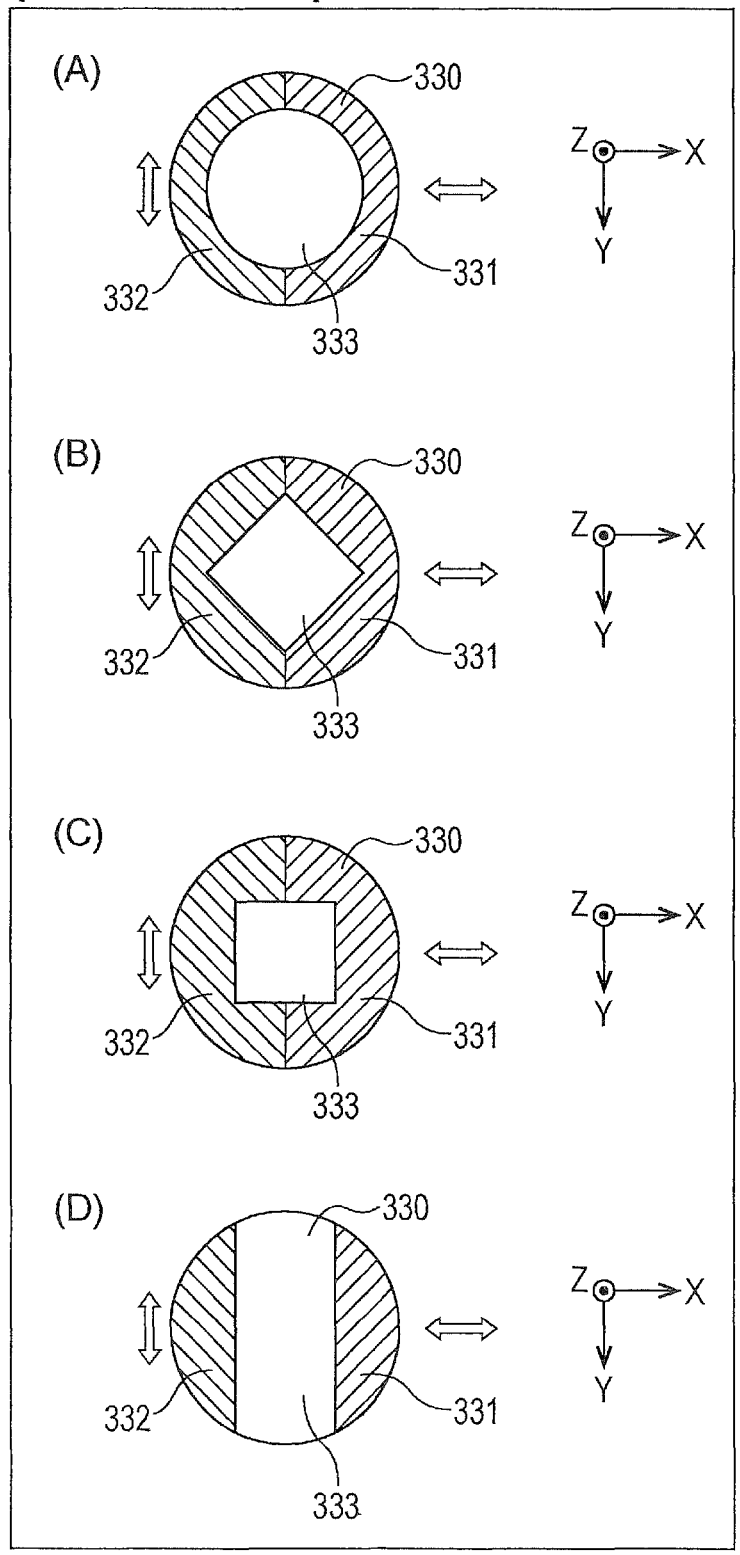
FIGS. 8(A) to 8(D) are schematic views illustrating a first polarization means provided in an image-capturing apparatus according to a third embodiment.

Therefore, when the first polarization means 330 according to the third embodiment is employed, a sufficiently long base line length of the parallax between both of the eyes can be ensured while increasing the light density received by the image-capturing device array 40. As shown in the schematic drawing of the first polarization means 330 in FIG. 8(A), when he external shape of the first polarization means 330 is a circular shape, the central region 333 can be in a circular shape, and the first region 331 and the second region 332 can be in a shape of sector having a central angle of 180 degrees enclosing the central region 333. Alternatively, as shown in the schematic drawing of the first polarization means 330 in FIGS. 8(B) and 8(C), the central region 333 can be in a rhombic or square shape, and the first region 331 and the second region 332 can be in a shape similar to a sector having a central angle of 180 degrees enclosing the central region 333. Alternatively, as shown in the schematic drawing of the first polarization means 330 in FIG. 8(D), the first region 331, the central region 333, and the second region 332 can be in a belt-like shape extending in the second direction.

Except these features, the configuration and the Structure of the image-capturing apparatus according to the third embodiment may be the same as the configuration and the structure of the image-capturing apparatus 110 explained in the first embodiment, and detailed description thereabout is omitted. The configuration and the structure of the image-capturing apparatus according to the third embodiment can be applied to the image-capturing apparatuses according to the fourth embodiment to the tenth embodiment explained later.

Fourth Embodiment

Figure 9:
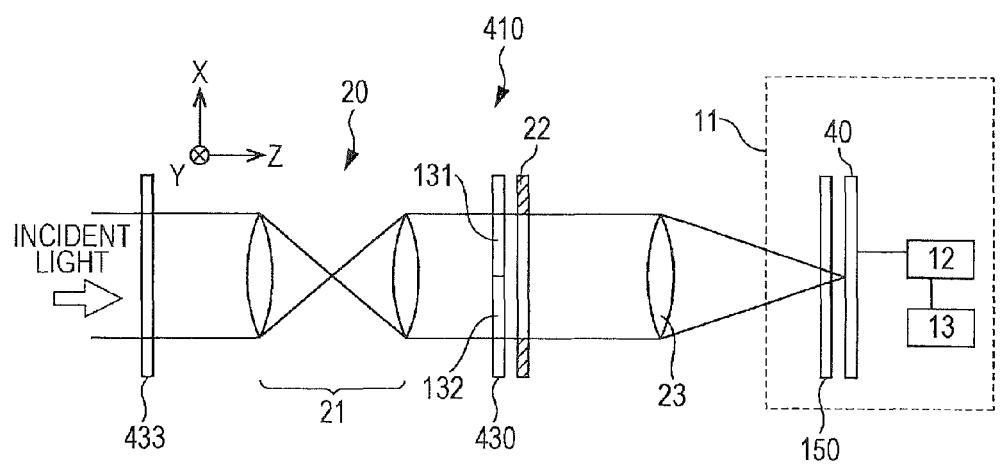
FIG. 9 is a conceptual diagram illustrating an image-capturing apparatus according to a fourth embodiment.

The fourth embodiment is also a modification of the first embodiment. A conceptual diagram illustrating an image-capturing apparatus 410 according to the fourth embodiment is shown in FIG. 9.

In the image-capturing apparatus 410 according to the fourth embodiment, a quarter wavelength plate (λ/4 wavelength plate) 433 is arranged at a light incident side of first polarization means 430, so that so-called binocular rivalry can be avoided. The quarter wavelength plate 433 may be detachably attached to a filter attachment unit provided in the lens system. The light that passed the quarter wavelength plate 433 is in a state in which the polarization direction is the same (the state of linear polarization). In an image obtained by such light having passed the first region 131 and the third region 151 and having reached the image-capturing device array 40 and an image obtained by such light having passed the second region 132 and the fourth region 152 and having reached the image-capturing device array 40, there is no great difference between the images in a portion of a subject in which the P wave component is reflected but the S wave component is absorbed, so that the binocular rivalry can be avoided.

Figure 11:
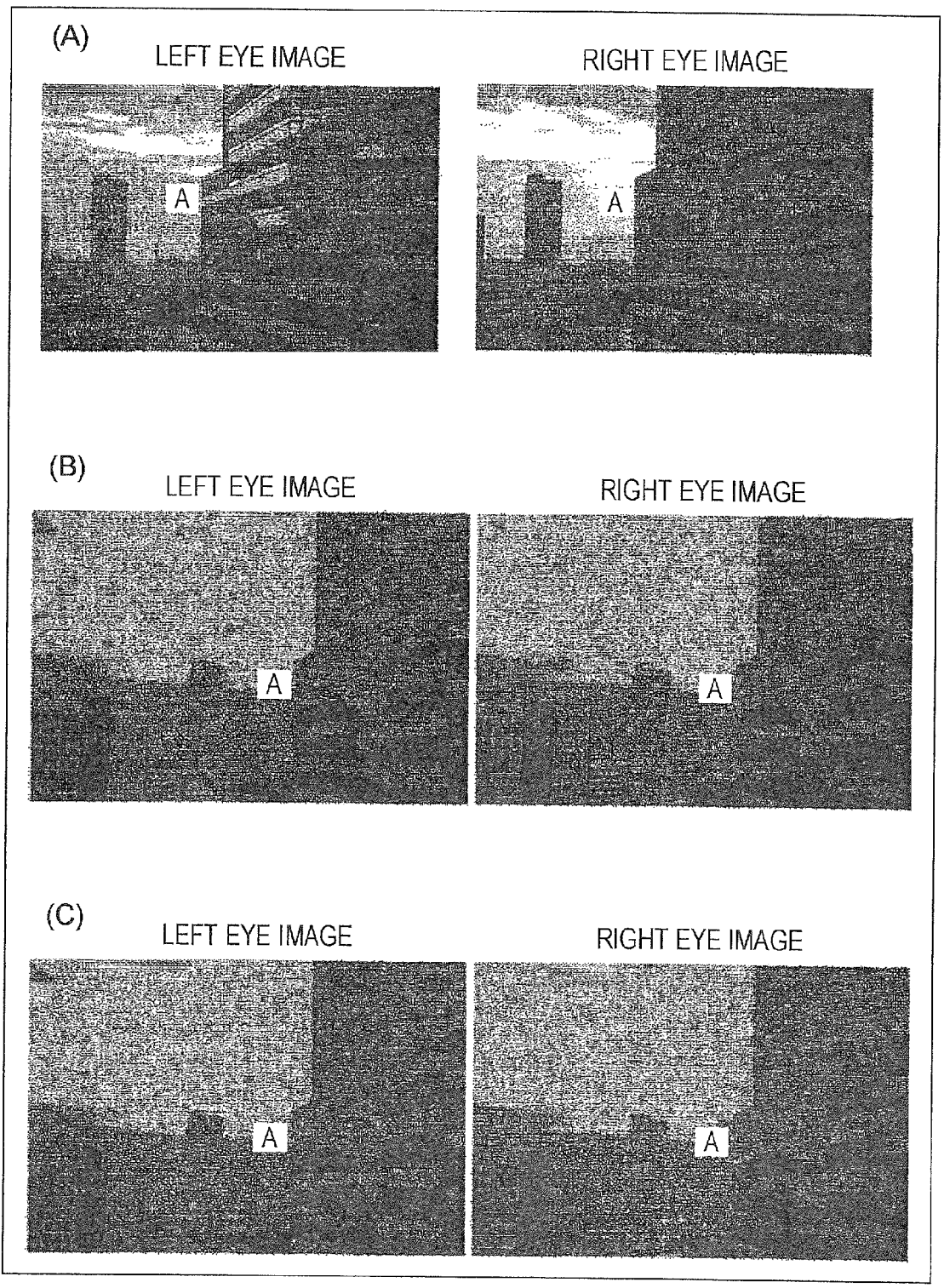
FIGS. 11(A), 11(B), and 11(C) are figures serving as pictures of left eye images and right eye images obtained by the image-capturing apparatus according to the first, fourth, and fifth embodiments.

FIGS. 11(A) and 11(B) show a left eye image (image at the left-hand side of FIGS. 11(A) and 11(B)) and a right eye image (image at the right-hand side of FIGS. 11(A) and 11(B)). In the fourth embodiment, a first region transmission light $L_1$ is configured to mainly include S wave (TE wave) as a polarization component, and the second region transmission light $L_2$ is configured to mainly include P wave (TM wave) as a polarization component.

It is understood that, when the left eye image and the right eye image of FIG. 11(A) obtained by the image-capturing apparatus 110 explained in the first embodiment are compared, for example, the light reflection states are particularly different in a glass window in a region indicated by "A" and a glass window located at the lower side of this glass window. Therefore, when a subject that reflects P wave component but absorbs S wave component is captured, and the image obtained from the P wave component and the image obtained from the S wave component are presented to both eyes, fusion does not occur, and binocular rivalry occurs, in which the images are seen alternately in such a manner that only one of the images is seen more strongly, and the images suppress each other in an overlapping region.

On the other hand, it is understood that, when the left eye image and the right eye image of FIG. 11(B) obtained by the image-capturing apparatus 410 explained in the fourth embodiment are compared, for example, the light reflection states are almost the same in a glass window in a region indicated by "A" and a glass window located at the lower side of this glass window, so that binocular rivalry can be avoided. The configuration and the structure of the image-capturing apparatus 410 according to the fourth embodiment can be applied to the image-capturing apparatuses according to the sixth embodiment to the eighth embodiment explained later. The fast axis of the quarter wavelength plate 433 is preferably at a predetermined angle to the direction of the electric field of the first region transmission light (more specifically, angle of 45 degrees or angle of 45 degrees±10 degrees) in the image-capturing apparatus explained in the first embodiment or the second embodiment.

Fifth Embodiment

Figure 10:
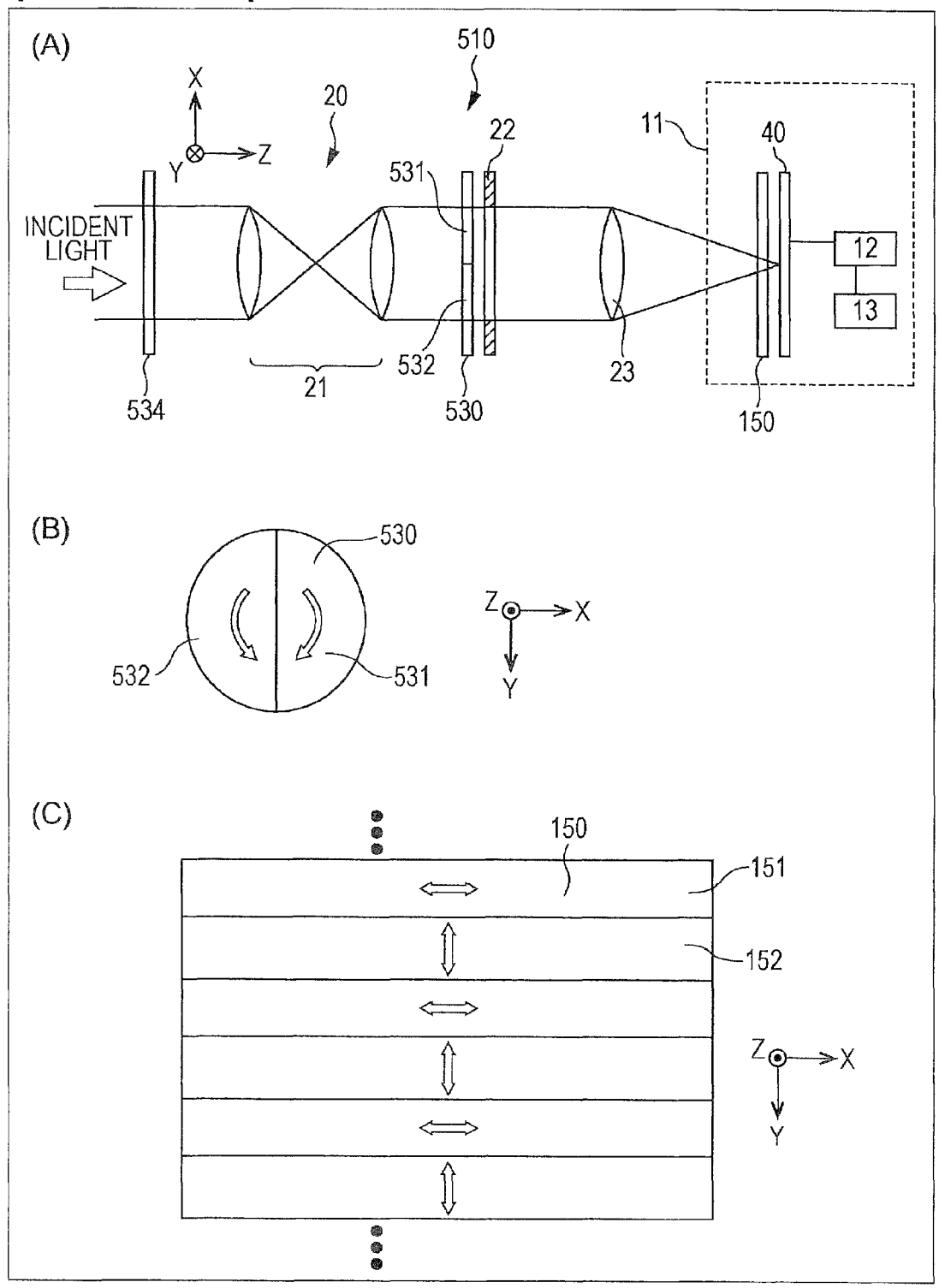
FIGS. 10(A), 10(B), and 10(C) are conceptual diagrams of an image-capturing apparatus according to a fifth embodiment, and is a diagram schematically illustrating the state of polarization of first polarization means and second polarization means.

The fifth embodiment is also a modification of the first embodiment. A conceptual diagram illustrating an image-capturing apparatus 510 according to the fifth embodiment is shown in FIG. 10(A). The states of polarization of first polarization means and second polarization means are schematically shown in FIGS. 10(B) and 10(C). In the image-capturing apparatus 510 according to the fifth embodiment, a polarization plate 534 having a polarization axis of a degrees is provided at a light incident side of first polarization means 530 in order to prevent binocular rivalry. A first region 531 is formed of a first wavelength plate, and a second region 532 is formed of a second wavelength plate. The direction of the electric field of the first region transmission light $L_1$ is perpendicular to the direction of the electric field of the second region transmission light $L_2$. More specifically, the value of α is 45 degrees, and the first wavelength plate constituting the first region 531 is formed of a half wavelength plate (+λ/2 wavelength plate), and the second wavelength plate constituting the second region 532 is formed of a half wavelength plate (−λ/2 wavelength plate) of which phase difference is different from the half wavelength plate constituting the first wavelength plate. Accordingly, the direction of the electric field of the first region transmission light $L_1$ is parallel to the first direction, and the direction of the electric field of the second region transmission light $L_2$ is parallel to the second direction. It should be noted that the polarization plate 534 is fixed to the lens system.

FIG. 11(C) shows a left eye image (image at the left-hand side of FIG. 11(C)) and a right eye image (image at the right-hand side of FIG. 11(C)). It is understood that, when the left eye image and the right eye image of FIG. 11(C) obtained by an image-capturing apparatus 510 explained in the fifth embodiment are compared, for example, the light reflection states are almost the same in a glass window in a region indicated by "A" and a glass window located at the lower side of this glass window, so that binocular rivalry can be avoided, like the fourth embodiment. The configuration and the structure of the image-capturing apparatus 510 according to the fifth embodiment can be applied to the image-capturing apparatuses according to the sixth embodiment to the tenth embodiment explained later.

Sixth Embodiment

The sixth embodiment is also a modification of the first embodiment. In the sixth embodiment, relationship between the extinction ratio and the parallax is studied. That is, when images separated into the right and the left are mixed, composite image simulation is performed by changing the extinction ratio from ∞ (state in which there is 0% crosstalk, and the left eye image and the right eye image are completely separated) to 1 (state in which there is 50% crosstalk, and the left eye image and the right eye image are completely mixed, i.e., the left eye image and the right eye image are completely the same) to find what level of mixing eliminates parallax, i.e., what level of mixing disables three-dimensional view. A portion of the result is shown in FIGS. 12(A) and 12(B).

In this case, FIG. 12(A) shows the state in which the extinction ratio is ∞, and FIG. 12(B) shows the state in which the extinction ratio is 3 (25% crosstalk). In the figure at the left-hand side (left eye image) and the figure at the right-hand side (right eye image) of FIGS. 12(A) and 12(B), the distance between a solid line and a broken line extending in the vertical direction is the same. When the figure at the left-hand side (left eye image) and the figure at the right-hand side (right eye image) of FIGS. 12(A) and 12(B) are compared, the position of the nose of a plaster bust located behind an apple is slightly different. When FIGS. 12(A) and 12(B) are compared, the difference of the position of the nose of the plaster bust in FIG. 12(A) is less than that in FIG. 12(B). Although not shown in the figures, when the extinction ratio is 1, the position of the nose of the plaster bust located behind the apple is the same in the left eye image and the right eye image. When the extinction ratio is 10 (10% crosstalk), the difference of the position of the nose of the plaster bust is less than that in FIG. 12(A), and is more than that in FIG. 12(B). It is understood from the above result that the extinction ratio of the polarizer is preferably 3 or more.

Seventh Embodiment

Figure 13:
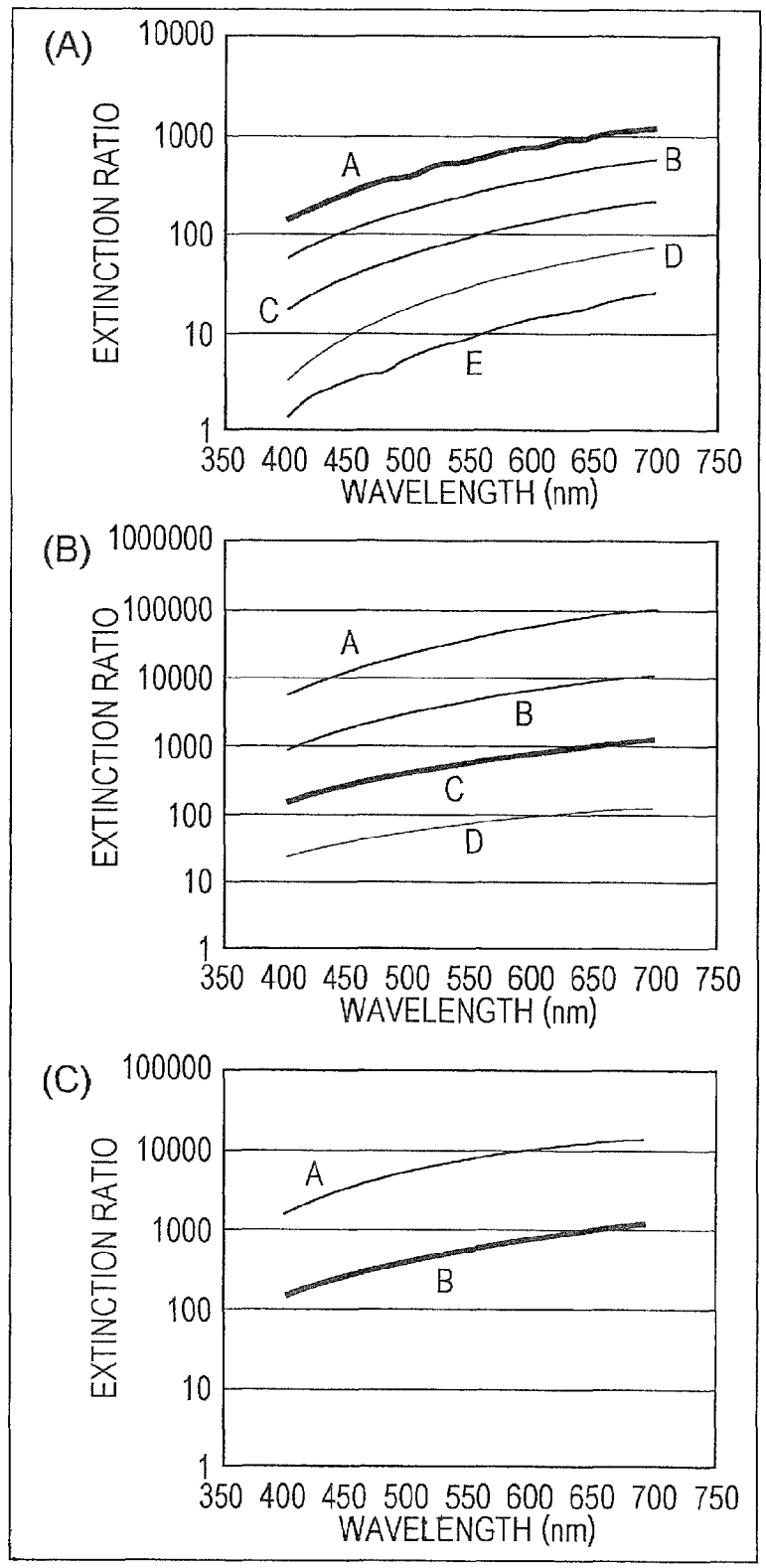
FIGS. 13(A), 13(B), and 13(C) are graphs illustrating results showing relationship of an extinction ratio and a wavelength of incident light and a pitch of a wire constituting a wire grid polarizer, relationship of an extinction ratio and a wavelength of incident light and a height of a wire constituting a wire grid polarizer, and relationship of an extinction ratio and a wavelength of incident light and (width/pitch) of a wire constituting a wire grid polarizer in a seventh embodiment.

The seventh embodiment is also a modification of the first embodiment. In the seventh embodiment, relationship between the specification of the wire grid polarizer and the extinction ratio is obtained by calculation. More specifically, relationship of an extinction ratio and a wavelength (λ) of incident light and a pitch of a wire constituting a wire grid polarizer is shown in FIG. 13(A). The width of the wire is ⅓ of the pitch of the wire, the height of the wire is 150 nm, and the length of the wire is infinite. In FIG. 13(A), a curved line "A" represent data when the pitch is 150 nm, a curved line "B" represent data when the pitch is 175 nm, a curved line "C" represent data when the pitch is 200 nm, a curved line "D" represent data when the pitch is 250 nm, and a curved line "E" represent data when the pitch is 300 nm. A relationship between the extinction ratio and the wavelength (λ) of the incident light and the height of the wire constituting the wire grid polarizer is shown in FIG. 13(B). The width of the wire is 50 nm. The length of the wire is infinite. The pitch of the wire is 150 nm. In FIG. 13(B), a curved line "A" represent data when the height is 250 nm, a curved line "B" represent data when the height is 200 nm, a curved line "C" represent data when the height is 150 nm, and a curved line "D" represent data when the height is 100 nm. Further, a relationship between the extinction ratio and the wavelength (λ) of the incident light and (width/pitch) of the wire constituting the wire grid polarizer is shown in FIG. 13(C). The width of the wire is 50 nm, the height of the wire is 150 nm, and the length of the wire is infinite. In FIG. 13(C), a curved line "A" represent data when the value of (width/pitch) is 0.50, and a curved line "B" represent data when the value of (width/pitch) is 0.33.

As can be seen from FIG. 13(A), it is understood that, for example, in order to set the extinction ratio at 10 or more, the pitch of the wire is preferably 200 nm or less, the height of the wire is preferably $5 \times 10^{-8}$ m (50 nm) or more, and the value of (width/pitch) of the wire is preferably 0.33 or more. Further, ten wires or more are preferably provided.

Figure 14:
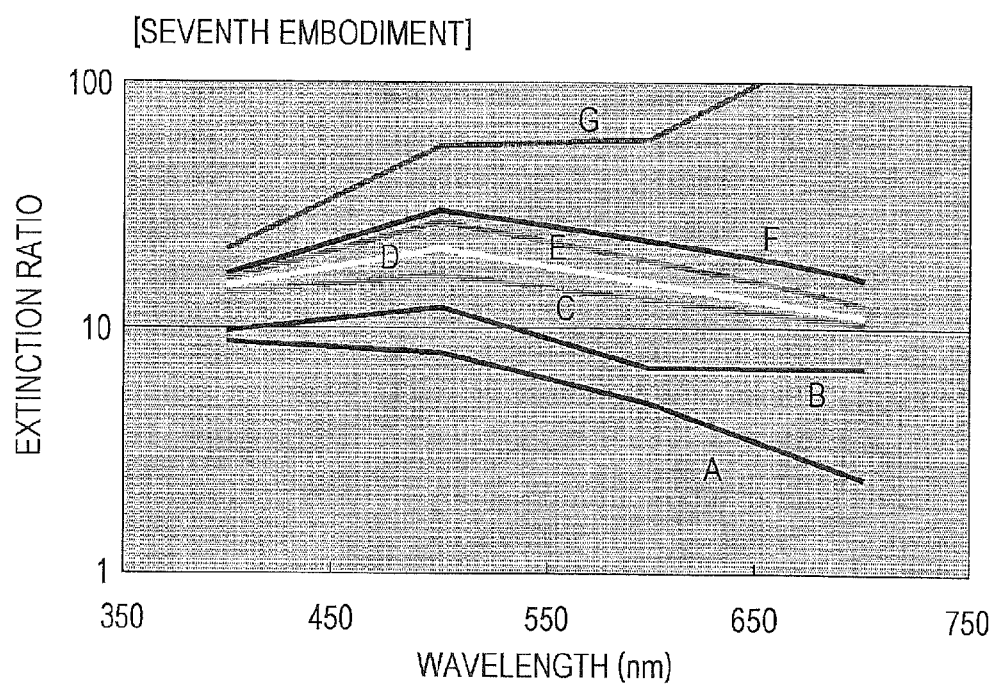
FIG. 14 is a graph illustrating a result showing relationship of an extinction ratio and a wavelength of incident light and lengths of two wires constituting a wire grid polarizer in a seventh embodiment.

A relationship between the extinction ratio and the wavelength (λ) of the incident light and the lengths of the two wires is shown in FIG. 14. The width of the wire is 50 nm, the height of the wire is 150 nm, and the pitch of the wire is three times the width of the wire. In FIG. 14, "A" represents data when the length is 1 μm, "B" represents data when the length is 2 μm, "C" represents data when the length is 3 μm, "D" represents data when the length is 4 μm, "E" represents data when the length is 5 μm, "F" represents data when the length is 6 μm, and "G" represents data when the length is infinite. As can be seen from FIG. 14, it is understood that, in order to set the extinction ratio at 10 or more, the length of the wire is preferably 2 μm or more, and is more preferably 3 μm or more. Further, it is understood that, for ease of processing, the material constituting the wire is preferably aluminum or aluminum alloy.

Eighth Embodiment

Figure 15:
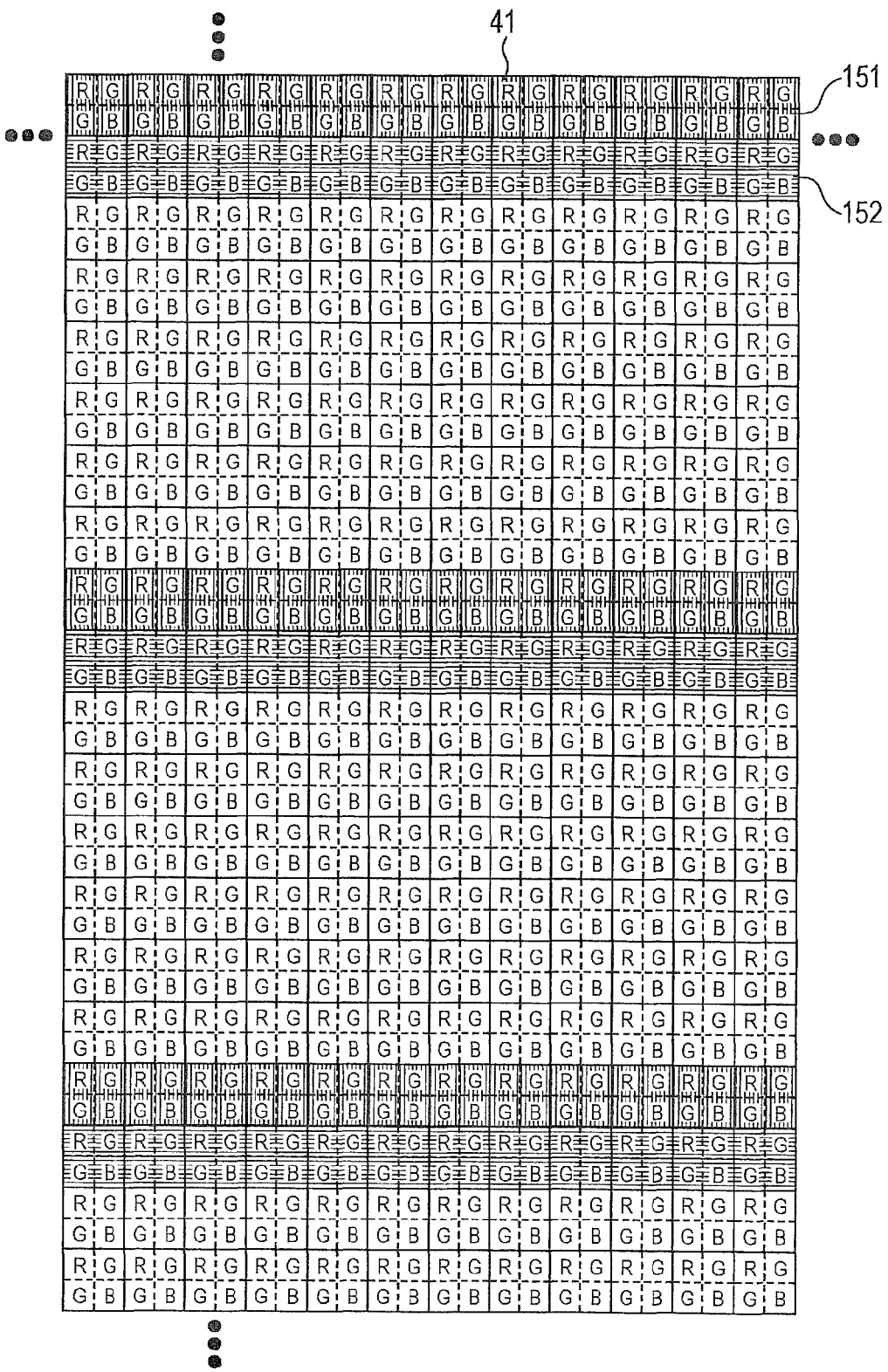
FIG. 15 is a conceptual diagram illustrating an image-capturing device array having Bayer arrangement in an image-capturing apparatus according to an eighth embodiment.

The eighth embodiment is also a modification of the first embodiment. As shown in FIG. 15 illustrating a conceptual diagram of an image-capturing device array having Bayer arrangement, the image-capturing apparatus according to the eighth embodiment is configured such that one third region 151 and one fourth region 152 are arranged for N pixels along the second direction (where N is $2^n$, n being a natural number of 1 to 5, and more particularly in the eighth embodiment, n is 3). An electric signal for obtaining a right eye image and an electric signal for obtaining a left eye image are obtained on the basis of depth map (depth information) based on the amount of parallax generated from an electric signal obtained from first region transmission light that has passed the third region 151 and an electric signal obtained from second region transmission light that has passed the fourth region 152 and an electric signal from all the image-capturing devices 41 constituting the image-capturing device array 40, but such method itself may be a well-known method. It should be noted that demosaic processing may be performed on the basis of all the electric signals including all of the image-capturing devices arranged with the third regions and the fourth regions and all of the image-capturing devices not arranged with the third regions and the fourth regions, or image data can also be generated by performing interpolation by super-resolution processing on portions where rows of image-capturing device groups arranged with the third regions and the fourth regions are interlaced. The number of pixels and the image quality of the depth map with respect to the number of pixels and the image quality of the image may not be 1:1. This is because, in most situations of image-capturing, each subject is sufficiently larger than the pixel resolution, and unless each subject has a distant difference that is of the same fineness as the pixel resolution, the same distance information resolution as the pixel resolution of the image is not required. When the resolution in the horizontal direction is sufficient in terms of feeling of distance difference, a low resolution in the vertical direction would not cause much awkwardness.

Figure 16:
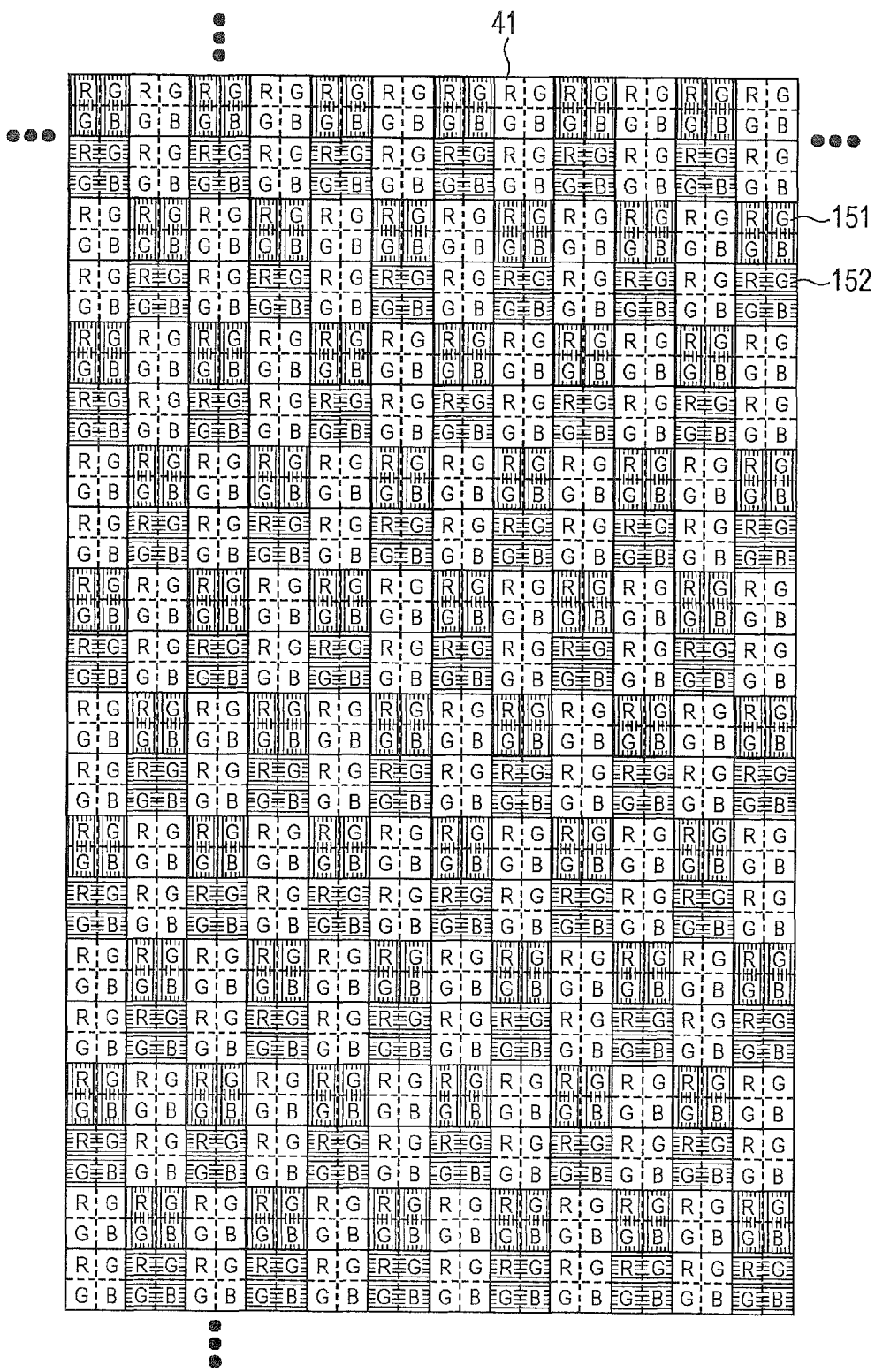
FIG. 16 is a conceptual diagram illustrating an image-capturing device array having Bayer arrangement of a first modification of the image-capturing apparatus according to the eighth embodiment.

Alternatively, a conceptual diagram illustrating an image-capturing device array having Bayer arrangement according to the first modification of the image-capturing apparatus according to the eighth embodiment is shown in FIG. 16, and one third region 151 and one fourth region 152 can be arranged for two pixels along the first direction. In the example as shown in FIG. 16, the third regions 151 and the fourth regions 152 are arranged in zigzag pattern (checkerboard pattern). That is, along the second direction, the third region 151 is adjacent to the fourth region 152 at one of the borders of the third region 151, but the third region 151 is not adjacent to the fourth region 152 at the other of the borders of the third region 151.

Figure 17:
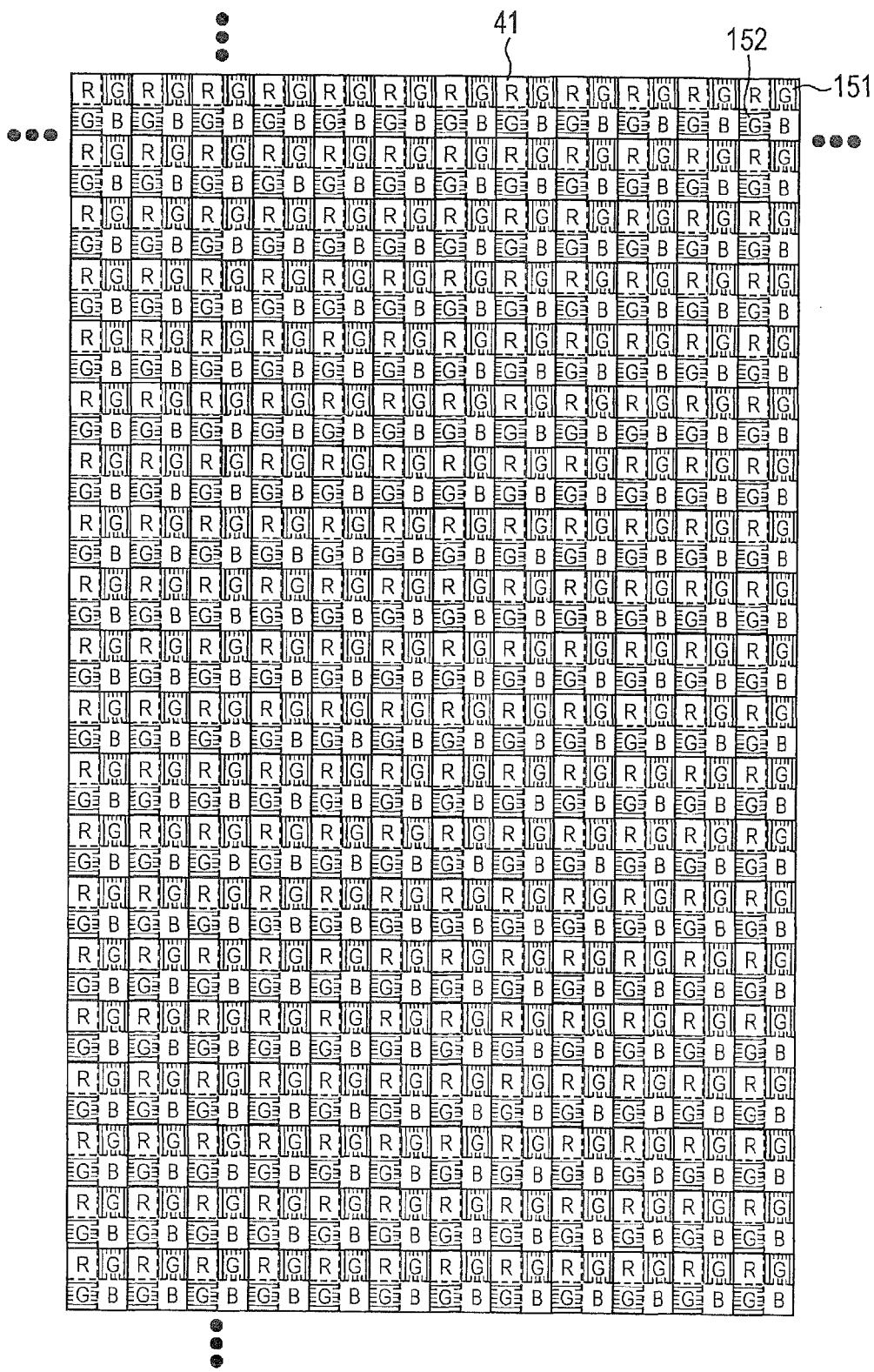
FIG. 17 is a conceptual diagram illustrating an image-capturing device array having Bayer arrangement of a second modification of the image-capturing apparatus according to the eighth embodiment.
Figure 18:
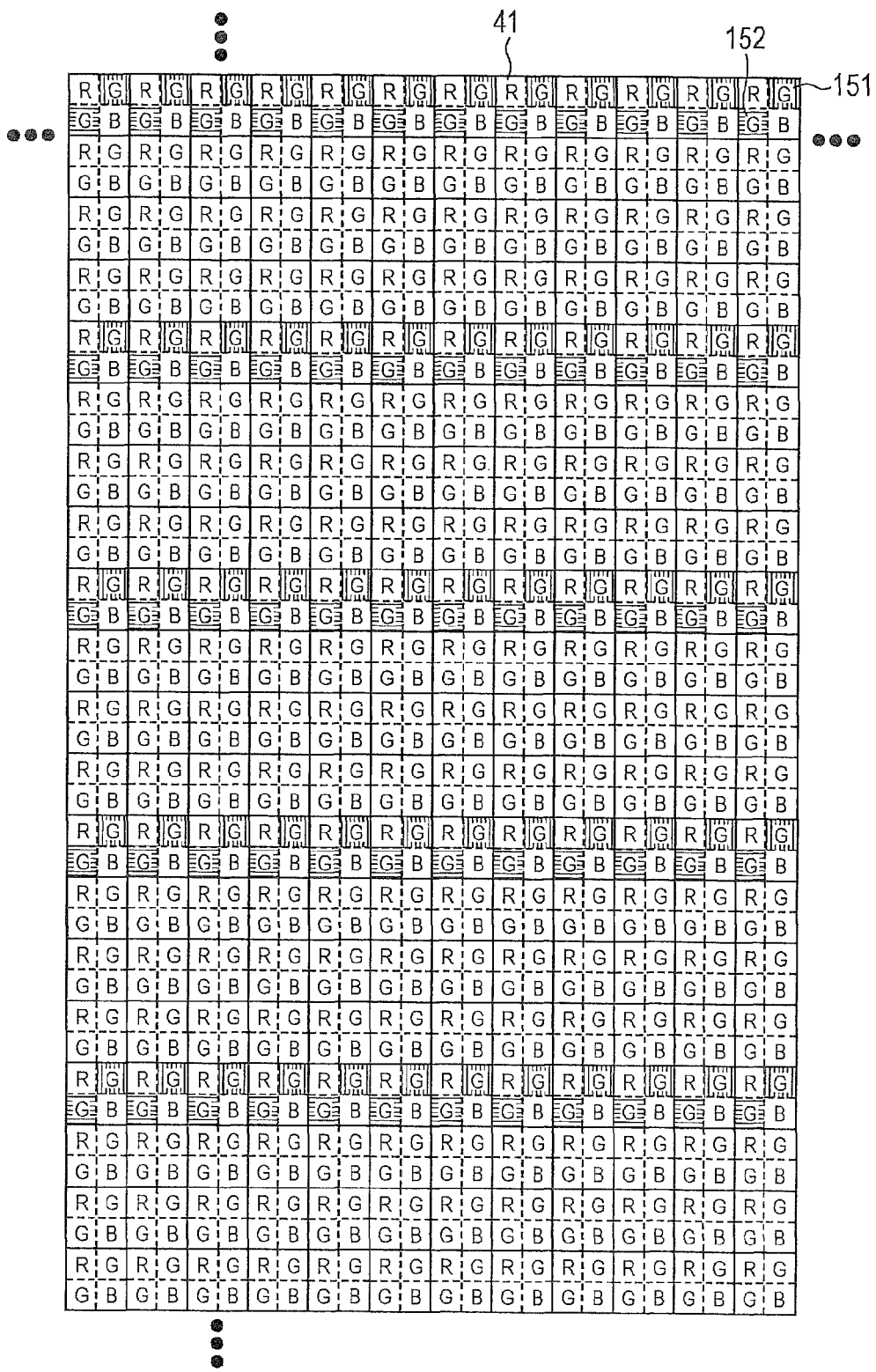
FIG. 18 is a conceptual diagram illustrating an image-capturing device array having Bayer arrangement of a third modification of the image-capturing apparatus according to the eighth embodiment.
Figure 19:
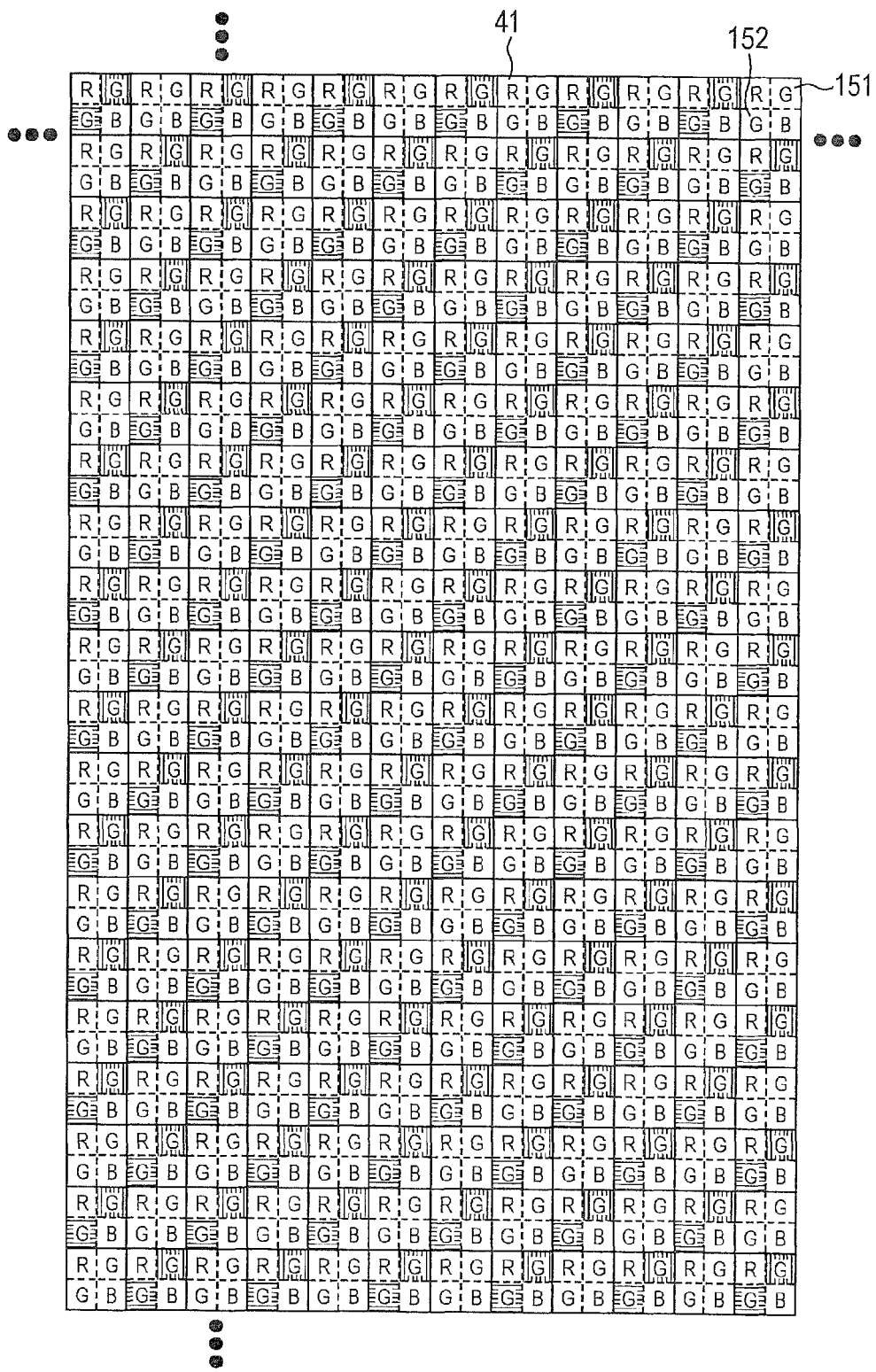
FIG. 19 is a conceptual diagram illustrating an image-capturing device array having Bayer arrangement of a fourth modification of the image-capturing apparatus according to the eighth embodiment.

Alternatively, a conceptual diagram illustrating an image-capturing device array having Bayer arrangement according to the second modification of the image-capturing apparatus according to the eighth embodiment is shown in FIG. 17, and the third region 151 and the fourth region 152 may not be arranged for the blue image-capturing device B receiving blue color light and the red image-capturing device R receiving red color light, and the third region 151 may be arranged for one of the two green image-capturing devices G receiving green color light, and the fourth region 152 may be arranged for the other of them. A conceptual diagram illustrating an image-capturing device array having Bayer arrangement according to the third modification of the image-capturing apparatus according to the eighth embodiment is shown in FIG. 18, and the third region 151 may be arranged for one of the two green image-capturing devices G receiving green color light, and the fourth region 152 is arranged for the other of them, and one third region 151 and one fourth region 152 may be arranged for N pixels along the second direction (where N is $2^n$, and in the example as shown in the figure, n is 2). As shown in FIG. 19, the third regions 151 and the fourth regions 152 may be arranged in zigzag pattern (checkerboard pattern).

Ninth Embodiment

Figure 20:
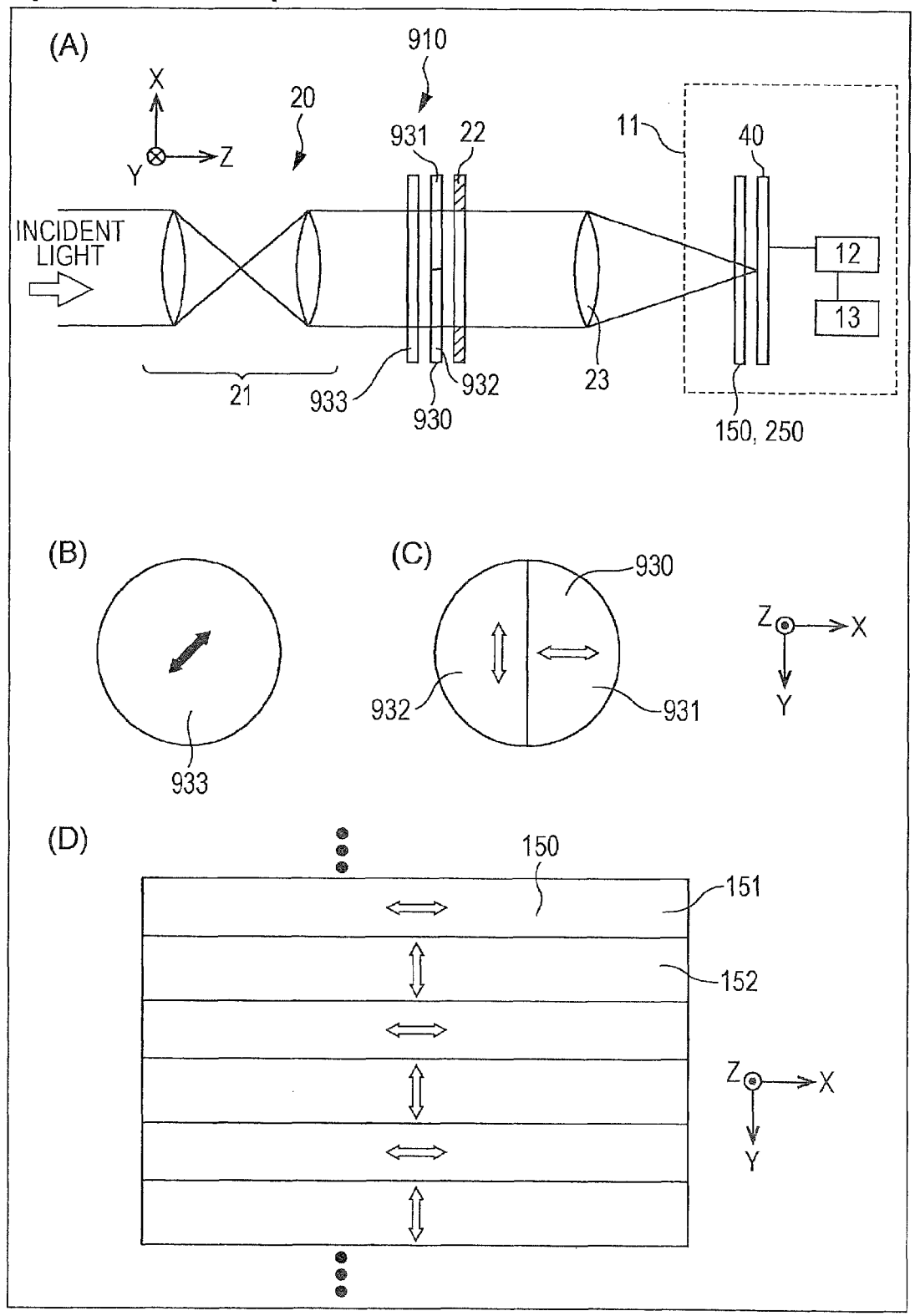
FIGS. 20(A), 20(B), 20(C), and 20(D) are a conceptual diagram illustrating an image-capturing apparatus according to a ninth embodiment, a conceptual diagram illustrating a quarter wavelength plate, a figure schematically illustrating the state of polarization of first polarization means, and a figure schematically illustrating the state of polarization of polarization means (second polarization means).

The ninth embodiment relates to an image-capturing apparatus according to the second aspect of this disclosure, and is a modification of the first embodiment to the third embodiment and the fifth embodiment to the eighth embodiment. A conceptual diagram illustrating an image-capturing apparatus according to the ninth embodiment is shown in FIG. 20(A). A conceptual diagram illustrating a quarter wavelength plate is shown in FIG. 20(B). The state of polarization of the first polarization means is schematically shown in FIG. 20(C). The state of polarization of the polarization means (second polarization means) is schematically shown in FIG. 20(D).

When an image-capturing apparatus 910 according to the ninth embodiment is expressed in accordance with the image-capturing apparatus according to the second aspect of this disclosure, the image-capturing apparatus 910 includes: (A) a quarter wavelength plate 933; (B) a lens system 20 for condensing light from the quarter wavelength plate 933; and (C) an image-capturing device array 40 in which image-capturing devices 41 are arranged in a two-dimensional matrix form in a first direction (horizontal direction, X axis direction) and a second direction perpendicular to the first direction (vertical direction, Y axis direction), wherein polarization means 150, 250 are provided at a light incident side, and the image-capturing device array 40 converts the light condensed by the lens system 20 into an electric signal.

The polarization means 150, 250 are arranged alternately along the second direction (vertical direction, Y axis direction), and include multiple fifth regions 151, 251 and sixth regions 152, 252 extending in the first direction (horizontal direction, X axis direction), a polarization state of a fifth region transmission light having passed the fifth regions 151, 251 is different from a polarization state of a sixth region transmission light having passed the sixth regions 152, 252, and a fast axis of the quarter wavelength plate 933 (indicated by black arrows in FIG. 20(B), FIG. 21(A), 21(D), 21(E)) is at a predetermined angle to the direction of the electric field of the fifth region transmission light. In this case, the predetermined angle is 45 degrees or 45 degrees±10 degrees. This is also applicable to the following cases. The direction of the electric field of the fifth region transmission light is perpendicular to the direction of the electric field of the sixth region transmission light. The direction of the electric field of the fifth region transmission light is parallel to the first direction (see FIG. 20(D)). Alternatively, the direction of the electric field of the fifth region transmission light) is at 45 degrees to the first direction (see FIG. 21(C)). The quarter wavelength plate 933 has a configuration and a structure similar to diaphragm blades of a lens, and is arranged within the lens system 20.

Alternatively, when the image-capturing apparatus 910 according to the ninth embodiment is expressed in accordance with the image-capturing apparatus according to the first aspect of this disclosure, the quarter wavelength plate 933 is arranged at the light incident side of the first polarization means 930, and the fast axis of the quarter wavelength plate 933 is at a predetermined angle to the direction of the electric field of the first region transmission light $L_1$. It should be noted that the direction of the electric field of the first region transmission light $L_1$ is parallel to the direction of the electric field of the third region transmission light $L_3$, and the direction of the electric field of the second region transmission light $L_2$ is parallel to the direction of the electric field of the fourth region transmission light $L_4$.

Figure 6:
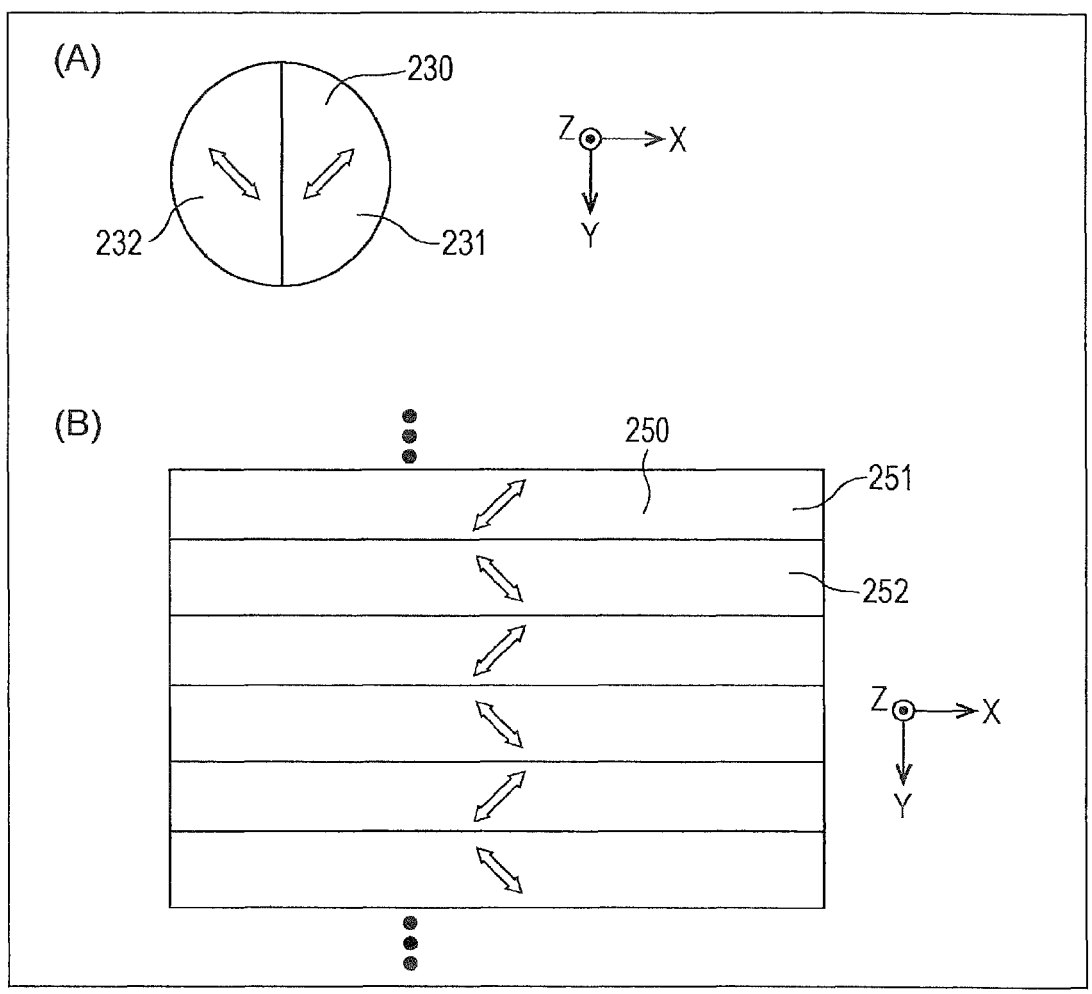
FIGS. 6(A) and 6(B) are figure schematically illustrating the state of polarization by the first polarization means and second polarization means provided in an image-capturing apparatus according to a second embodiment.
Figure 21:
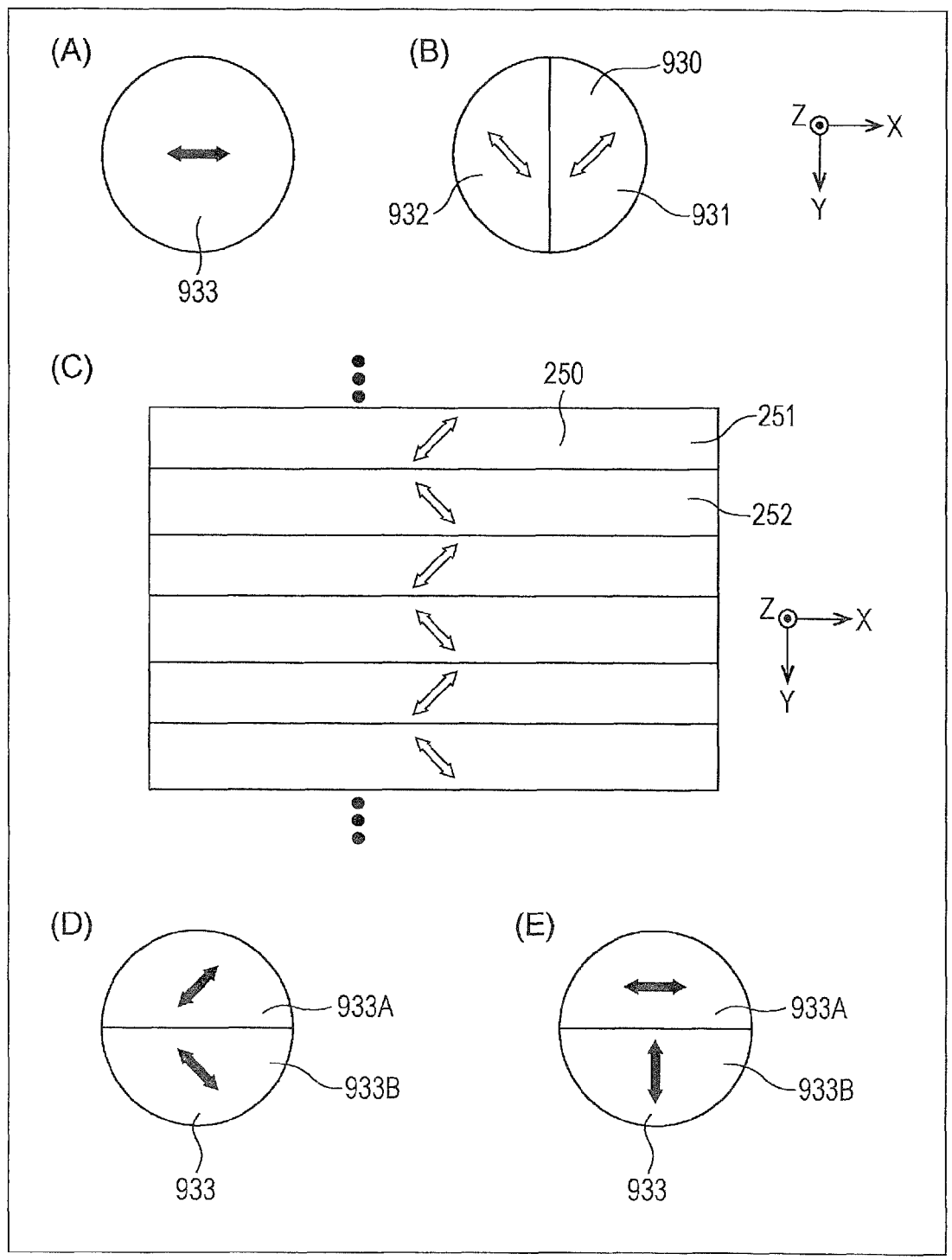
FIGS. 21(A), 21(B), and 21(C) are respectively a conceptual diagram illustrating a quarter wavelength plate in an image-capturing apparatus according to a ninth embodiment, a figure schematically illustrating the state of polarization of first polarization means, and a figure schematically illustrating the state of polarization in polarization means (second polarization means)
FIGS. 21(D) and 21(E) are conceptual diagrams illustrating a quarter wavelength plate in an image-capturing apparatus according to a tenth embodiment.

The first polarization means 930 is detachably attached to the lens system 20, and the quarter wavelength plate 933 is also detachably attached to the lens system 20. The quarter wavelength plate 933 is arranged adjacent to the first polarization means 930. FIG. 20(A) shows the quarter wavelength plate 933 and the first polarization means 930 which are arranged in order from the light incident side. Alternatively, depending on cases, the first polarization means 930 may be arranged first and then the quarter wavelength plate 933 may be arranged subsequently. When the quarter wavelength plate 933 and the first polarization means 930 are arranged in order from the light incident side, and the quarter wavelength plate 933 and the first polarization means 930 are arranged in the lens system, a three-dimensional image (three-dimensional image) can be captured, or when the first polarization means 930 is arranged in the lens system and the quarter wavelength plate 933 is detached from the lens system, a three-dimensional image (three-dimensional image) can be captured. When the quarter wavelength plate 933 is arranged in the lens system and the first polarization means 930 is detached from the lens system, a two-dimensional image can be captured. On the other hand, when the first polarization means 930 and the quarter wavelength plate 933 are arranged in order from the light incident side, and the first polarization means 930 is arranged in the lens system, and the quarter wavelength plate 933 is detached from the lens system, a three-dimensional image (three-dimensional image) can be captured. When the quarter wavelength plate 933 is arranged in the lens system and the first polarization means 930 is detached from the lens system, a two-dimensional image can be captured. The fast axis of the quarter wavelength plate 933 indicated by a black arrow extending in an 45 degrees obliquely right direction in FIG. 20(B) is not limited to such direction. Alternatively, it may extend in an 45 degrees obliquely left direction. FIGS. 21(A), 21(B), and 21(C) illustrate a conceptual diagram illustrating a modification of the quarter wavelength plate of the image-capturing apparatus according to the ninth embodiment and the state of polarization of the first polarization means and the state of polarization of the polarization means (second polarization means), and this example is a modification of the second embodiment as shown in FIG. 6.

When the first polarization means 930 is detached from the lens system 20 to try normal image-capturing of a two-dimensional image, and if light incident upon the image-capturing apparatus includes linear polarization, the strength of light having passed the third regions (fifth regions) 151, 251 becomes different from the strength of light having passed the fourth regions (sixth regions) 152, 252, and this may cause stripe-like difference of brightness in the obtained two-dimensional image. In the image-capturing apparatus according to the ninth embodiment, the quarter wavelength plate 933 of which fast axis is at the predetermined angle (more specifically, 45 degrees or 45 degrees±10 degrees) to the direction of the electric field of the fifth region transmission light is incorporated, and therefore, the light of the linear polarization incident upon the quarter wavelength plate 933 is emitted from the quarter wavelength plate 933 as the light in the circular polarization state. Therefore, it is less likely that difference is caused between the strength of the light having passed the third regions (fifth regions) 151, 251 and the strength of the light having passed the fourth regions (sixth regions) 152, 252, and the stripe-like difference of brightness would not occur in the obtained two-dimensional image.

Tenth Embodiment

The tenth embodiment is a modification of the ninth embodiment. As shown in FIG. 21(D) or 21(E) illustrating a conceptual diagram of a quarter wavelength plate of an image-capturing apparatus according to the tenth embodiment, the quarter wavelength plate 933 includes a first quarter wavelength plate 933A and a second quarter wavelength plate 933B arranged along the second direction in the tenth embodiment. The first quarter wavelength plate 933A and the second quarter wavelength plate 933B are integrally formed. The fast axis of the first quarter wavelength plate 933A is at a predetermined angle to the direction of the electric field of the fifth region transmission light, and the fast axis of the second quarter wavelength plate 933B is perpendicular to the fast axis of the first quarter wavelength plate 933A. In other words, the first quarter wavelength plate 933A is parallel to a slow axis. In this case, the predetermined angle is 45 degrees or 45 degrees±10 degrees. The example as shown in FIG. 21(D) is a modification of an example as shown in FIG. 20(B), and the example as shown in FIG. 21(E) is a modification of the example as shown in FIG. 21(B). Except the above points, the image-capturing apparatus according to the tenth embodiment has the same configuration and structure as the image-capturing apparatus according to the ninth embodiment, and detailed description thereabout is omitted. The quarter wavelength plate 933 includes the first quarter wavelength plate 933A and the second quarter wavelength plate 933B, so that difference is less likely to occur between the strength of the light having passed the third regions (fifth regions) 151, 251 and the strength of the light having passed the fourth regions (sixth regions) 152, 252.

Figure 22:
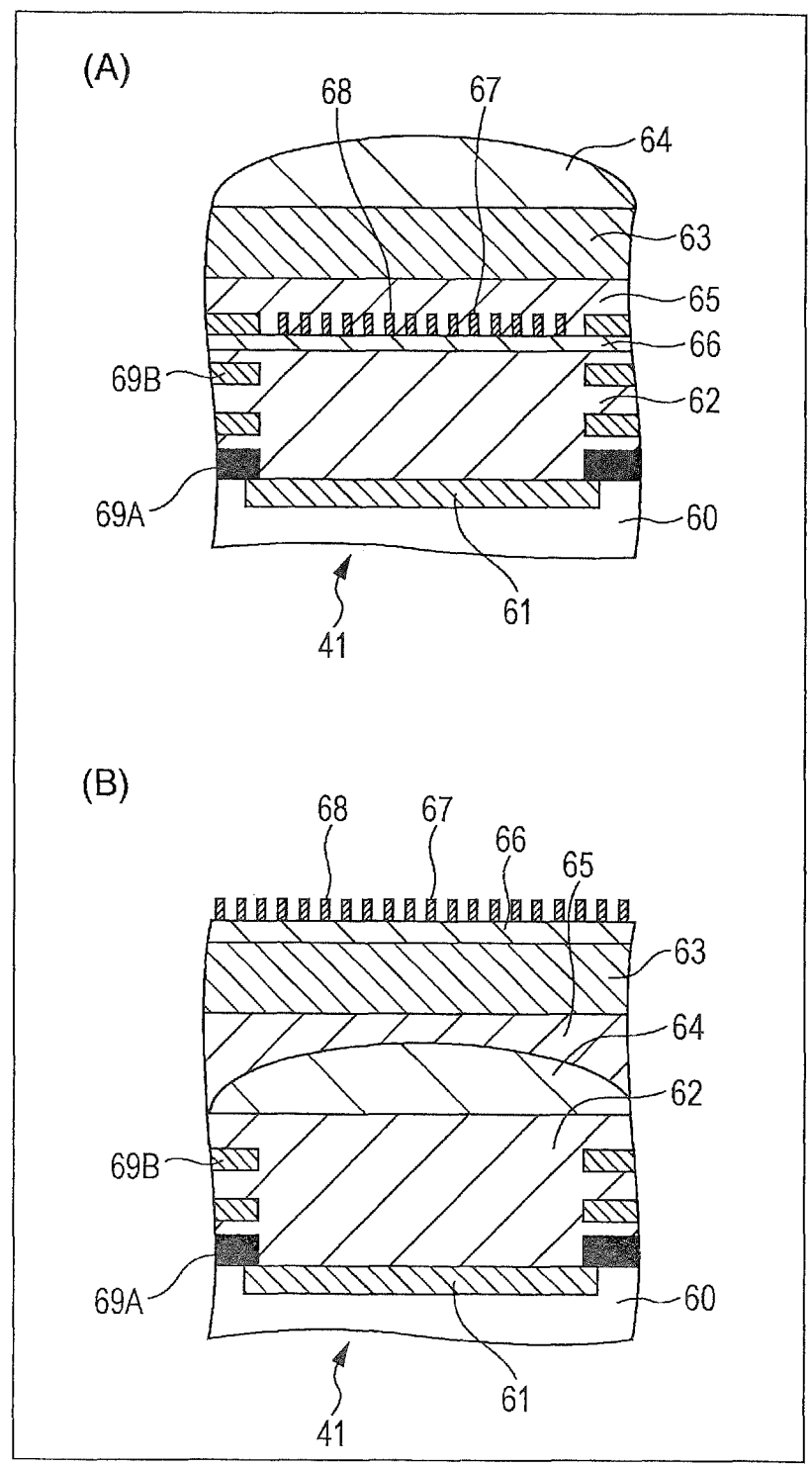
FIGS. 22(A) and 22(B) are partial cross sectional views schematically illustrating modifications of the image-capturing device.

Hereinabove, this disclosure has been explained on the basis of the preferred embodiments, but this disclosure is not limited to the embodiments. The configuration and the structure of the image-capturing apparatus and the image-capturing device explained in the embodiments are examples, and can be changed as necessary. For example, as FIG. 22(A) schematically shows a partial cross sectional view, the image-capturing device 41 may be configured to include the photoelectric conversion device 61 arranged on the silicon semiconductor substrate 60, and in addition, the first planarized film 62, the inorganic insulating ground layer 66, the wire grid polarizer 67, the second planarized film 65, the color filter 63, and the on-chip lens 64 may be laminated on the photoelectric conversion device 61. Alternatively, as FIG. 22(B) schematically shows a partial cross sectional view, the image-capturing device 41 may be configured to include the photoelectric conversion device 61 arranged on the silicon semiconductor substrate 60, and in addition, the first planarized film 62, the on-chip lens 64, second planarized film 65, the color filter 63, the inorganic insulating ground layer 66, and the wire grid polarizer 67 may be laminated on the photoelectric conversion device 61. The image-capturing device may be a front side illumination type as shown in the figure, or may be a back side illumination type which is not shown.

A three-dimensional image is displayed on the basis of the right eye image data and the left eye image data, and examples of such display methods include a method for attaching circular polarization or linear polarization filters to two projectors to display right and left eye images and allow a viewer to observe an image using circular polarization or linear polarization glasses corresponding to the display, a lenticular lens method, and a parallax barrier method. When an image is observed without using circular polarization or linear polarization glasses, an ordinary two-dimensional (flat) image can be observed. The processing procedure explained above may be understood as a method having the above series of procedures, or may be understood as a program for causing a computer to execute the series of procedures or a recording medium for recording the program. Examples of recording media include a CD (Compact Disc), an MD (MiniDisc), a DVD (Digital Versatile Disk), a memory card, and a Blu-ray Disc (registered trademark).

REFERENCE SIGNS LIST 110, 410, 510, 910 . . . image-capturing apparatus, 11 . . . camera main body unit, 12 . . . image processing means, 13 . . . image storage unit, 20 . . . lens system, 21 . . . image-capturing lens, 22 . . . diaphragm unit, 23 . . . image forming lens, 130, 230, 330, 430, 530, 930 . . . first polarization means, 131, 231, 331, 531, 931 . . . first region, 132, 232, 332, 532, 932 . . . second region, 333 . . . central region, 433, 933 . . . quarter wavelength plate (λ/4 wavelength plate), 933A . . . first quarter wavelength plate (λ/4 wavelength plate), 933B . . . second quarter wavelength plate (λ/4 wavelength plate), 534 . . . polarization plate, 40 . . . image-capturing device array, 41 . . . image-capturing device, 150, 250 . . . second polarization means (polarization means), 151, 251 . . . third region (fifth region), 152, 252 . . . fourth region (sixth region), 60 . . . silicon semiconductor substrate, 61 . . . photoelectric conversion device, 62 . . . first planarized film, 63 . . . color filter, 64 . . . on-chip lens, 65 . . . second planarized film, 66 . . . inorganic insulating ground layer, 67, 67A, 67B . . . wire grid polarizer, 68, 68A, 68B . . . wire

The invention claimed is:

1. An image-capturing apparatus comprising:
(A) first polarizer that polarizes light from a subject;
(B) a lens system that condenses light from the first polarizer; and
(C) an image-capturing device array in which image-capturing devices are arranged in a two-dimensional matrix form in a first direction and a second direction perpendicular to the first direction,
wherein a second polarizer is provided at a light incident side, and the image-capturing device array converts the light condensed by the lens system into an electric signal,
wherein the first polarizer includes a first region and a second region arranged along the first direction,
a polarization state of a first region transmission light having passed the first regions is different from a polarization state of a second region transmission light having passed the second regions,
the second polarizer includes a plurality of third regions and fourth regions arranged alternately along the second direction and extending in the first direction,
a polarization state of a third region transmission light having passed the third regions is different from a polarization state of a fourth region transmission light having passed the fourth regions,
the first region transmission light passes the third regions and reaches the image-capturing device, and the second region transmission light passes the fourth region and reaches the image-capturing device, and thus, an image is captured to obtain a three-dimensional image in which a distance between a barycenter of the first region and a barycenter of the second region is a base line length of parallax between both eyes.

2. The image-capturing apparatus according to claim 1, wherein the first polarizer is arranged in proximity to a diaphragm unit of the lens system.

3. The image-capturing apparatus according to claim 1, wherein a central region is provided between the first region and the second region in the first polarizer, and
a polarization state of a central region transmission light having passed the central region does not change from that before incidence to the central region.

4. The image-capturing apparatus according to claim 1, wherein the first region and the second region are formed of polarizers, and
a direction of an electric field of the first region transmission light is perpendicular to a direction of an electric field of the second region transmission light.

5. The image-capturing apparatus according to claim 4, wherein the direction of the electric field of the first region transmission light is parallel to the first direction.

6. The image-capturing apparatus according to claim 4, wherein the direction of the electric field of the first region transmission light is at 45 degrees to the first direction.

7. The image-capturing apparatus according to claim 4, wherein the direction of the electric field of the first region transmission light is parallel to the direction of the electric field of the third region transmission light, and
the direction of the electric field of the second region transmission light is parallel to the direction of the electric field of the fourth region transmission light.

8. The image-capturing apparatus according to claim 4, wherein an extinction ratio of the polarizer is 3 or more.

9. The image-capturing apparatus according to claim 4, wherein the image-capturing device is made by laminating a color filter, an on-chip lens, and a wire grid polarizer, and the wire grid polarizer constitutes the third region or the fourth region.

10. The image-capturing apparatus according to claim 4, wherein the image-capturing device is made by laminating a wire grid polarizer, a color filter, and an on-chip lens, and
the wire grid polarizer constitutes the third region or the fourth region.

11. The image-capturing apparatus according to claim 9, wherein a direction in which a plurality of wires constituting the wire grid polarizer extends is parallel to the first direction or the second direction.

12. The image-capturing apparatus according to claim 1, wherein a quarter wavelength plate is arranged at the light incident side of the first polarizer.

13. The image-capturing apparatus according to claim 5, wherein a quarter wavelength plate is arranged at the light incident side of the first polarizer, and
a fast axis of the quarter wavelength plate is at a predetermined angle to the direction of the electric field of the first region transmission light.

14. The image-capturing apparatus according to claim 5, wherein the quarter wavelength plate includes a first quarter wavelength plate and a second quarter wavelength plate arranged in the second direction,
a fast axis of the first quarter wavelength plate is at a predetermined angle to the direction of the electric field of the first region transmission light, and
a fast axis of the second quarter wavelength plate is perpendicular to the fast axis of the first quarter wavelength plate.

15. The image-capturing apparatus according to claim 13, wherein the predetermined angle is 45 degrees.

16. The image-capturing apparatus according to claim 13, wherein the direction of the electric field of the first region transmission light is parallel to the direction of the electric field of the third region transmission light, and
the direction of the electric field of the second region transmission light is parallel to the direction of the electric field of the fourth region transmission light.

17. The image-capturing apparatus according to claim 13, wherein the first polarizer is detachably attached to the lens system, and
the quarter wavelength plate is detachably attached to the lens system.

18. The image-capturing apparatus according to claim 13, wherein the quarter wavelength plate is arranged adjacent to the first polarizer.

19. The image-capturing apparatus according to claim 1, wherein a polarization plate having a polarization axis of cc degrees is arranged at the light incident side of the first polarizer,
the first region includes a first wavelength plate, and the second region includes a second wavelength plate, and
the direction of the electric field of the first region transmission light is perpendicular to the direction of the electric field of the second region transmission light.

20. The image-capturing apparatus according to claim 19, wherein the value of α is 45 degrees,
the first wavelength plate includes a half wavelength plate, and
the second wavelength plate includes a half wavelength plate of which phase difference is different from that of the half wavelength plate constituting the first wavelength plate.

21. The image-capturing apparatus according to claim 1, wherein the image-capturing device array has Bayer arrangement, and one pixel includes four image-capturing devices, and
one third region or fourth region is arranged for one pixel.

22. The image-capturing apparatus according to claim 1, wherein one third region and one fourth region are arranged for N pixels along the second direction (where N is $2^n$, n being a natural number of 1 to 5).

23. An image-capturing method using an image-capturing apparatus comprising:
(A) first polarizer that polarizes light from a subject;
(B) a lens system that condenses light from the first polarizer; and
(C) an image-capturing device array in which image-capturing devices are arranged in a two-dimensional matrix form in a first direction and a second direction perpendicular to the first direction,
wherein a second polarizer is provided at a light incident side, and the image-capturing device array converts the light condensed by the lens system into an electric signal,
wherein the first polarizer includes a first region and a second region arranged along the first direction,
a polarization state of a first region transmission light having passed the first regions is different from a polarization state of a second region transmission light having passed the second regions,
a second polarizer includes a plurality of third regions and fourth regions arranged alternately along the second direction and extending in the first direction,
a polarization state of a third region transmission light having passed the third regions is different from a polarization state of a fourth region transmission light having passed the fourth regions,
the first region transmission light passes the third region and reaches the image-capturing device, and the second region transmission light passes the fourth region and reaches the image-capturing device, and thus, an image is captured to obtain a three-dimensional image in which a distance between a barycenter of the first region and a barycenter of the second region is a base line length of parallax between both eyes, and
wherein the image-capturing device generates an electric signal for obtaining a right eye image with the first region transmission light having passed the third region and having reached the image-capturing device,
the image-capturing device generates an electric signal for obtaining a left eye image with the second region transmission light having passed the fourth region and having reached the image-capturing device, and
these electric signals are output.

24. The image-capturing method according to claim 23, wherein one third region and one fourth region are arranged for N pixels along the second direction (where N is $2^n$, n being a natural number of 1 to 5).

25. The image-capturing method according to claim 24, wherein image data for obtaining a right eye image and image data for obtaining a left eye image are obtained on the basis of depth map generated from an electric signal obtained from first region transmission light that has passed the third region and an electric signal obtained from second region transmission light that has passed the fourth region and an electric signal from all the image-capturing devices constituting the image-capturing device array.

* * * * *